(12) United States Patent
Tola et al.

(10) Patent No.: US 7,420,376 B2
(45) Date of Patent: Sep. 2, 2008

(54) METHOD OF SENSING ABSOLUTE POSITION OF A STRUCTURE USING A CAPACITIVELY COUPLED POSITION ENCODER

(75) Inventors: Jeffry Tola, Upland, CA (US); Kenneth A. Brown, Banning, CA (US)

(73) Assignee: TT electronics plc, Surrey (GB)

( * ) Notice: Subject to any disclaimer, the term of this patent is extended or adjusted under 35 U.S.C. 154(b) by 0 days.

(21) Appl. No.: 11/511,925

(22) Filed: Aug. 29, 2006

(65) Prior Publication Data

US 2006/0284622 A1    Dec. 21, 2006

Related U.S. Application Data

(62) Division of application No. 11/158,778, filed on Jun. 22, 2005, now Pat. No. 7,123,027.

(60) Provisional application No. 60/582,205, filed on Jun. 23, 2004.

(51) Int. Cl.
 *G01R 27/26* (2006.01)
 *G01B 5/24* (2006.01)

(52) U.S. Cl. .................. 324/661; 324/662; 324/686; 33/1 PT

(58) Field of Classification Search .......... 324/662, 324/661, 660, 658, 686, 690; 33/1 PT, 1 N, 33/706, 707, 708; 340/870.37; 714/724; 341/11, 15

See application file for complete search history.

(56) References Cited

U.S. PATENT DOCUMENTS

| | | | |
|---|---|---|---|
| 3,873,916 A | 3/1975 | Sterki | |
| 4,488,152 A | 12/1984 | Arnason et al. | |
| 4,638,249 A | 1/1987 | Tanaka et al. | |
| 4,851,835 A | 7/1989 | Krumholz et al. | |
| 5,049,825 A | 9/1991 | Kline | |
| 5,311,666 A | 5/1994 | Jacobsen et al. | |
| 5,394,096 A * | 2/1995 | Meyer | 324/686 |
| 5,485,468 A | 1/1996 | Kiriyama et al. | |
| 5,708,367 A | 1/1998 | Tousson | |
| 5,880,683 A | 3/1999 | Brandestini | |
| 6,054,851 A | 4/2000 | Masreliez et al. | |
| 6,170,162 B1 | 1/2001 | Jacobsen et al. | |
| 6,492,911 B1 | 12/2002 | Netzer | |

(Continued)

FOREIGN PATENT DOCUMENTS

EP     0 226 716 A2    9/1986

(Continued)

*Primary Examiner*—Hoai-An D Nguyen
(74) *Attorney, Agent, or Firm*—Krieg DeVault LLP

(57) ABSTRACT

A method of sensing absolute position of a structure includes: generating a signal pattern to repetitively provide a changing voltage to each of two or more tracks of a sensor, capacitively coupling an electrode of the sensor to the tracks to determine a first electrode position along the tracks by detecting a first group of signals emitted in response to the signal pattern, moving at least one of the electrode and the tracks relative to another of the electrode and the tracks to result in a second electrode position along the tracks different from the first electrode position, and detecting a second group of signals emitted in response to the signal pattern with the electrode capacitively coupled to the tracks to determine the second electrode position.

12 Claims, 18 Drawing Sheets

U.S. PATENT DOCUMENTS

| | | |
|---|---|---|
| 6,564,654 B2 | 5/2003 | Madni et al. |
| 6,892,590 B1 | 5/2005 | Andermo |
| 7,089,678 B2 * | 8/2006 | Novak et al. .................. 33/706 |
| 2006/0071671 A1 | 4/2006 | Tola et al. |
| 2006/0077072 A1 | 4/2006 | Tola et al. |

FOREIGN PATENT DOCUMENTS

| | | |
|---|---|---|
| WO | WO 03/023329 A1 | 3/2003 |

* cited by examiner

METHOD OF SENSING ABSOLUTE POSITION OF A STRUCTURE USING A CAPACITIVELY COUPLED POSITION ENCODER

CROSS-REFERENCE TO RELATED APPLICATIONS

The present application is a divisional of U.S. patent application Ser. No. 11/158,778 filed Jun. 22, 2005 now U.S. Pat. No. 7,123,027, which claims the benefit of U.S. Provisional Patent Application No. 60/582,205 filed on 23 Jun. 2004, each of which is hereby incorporated by reference in its entirety.

FIELD OF THE INVENTION

The present invention generally relates to the field of position sensors, and more specifically, but not exclusively, relates to non-contacting rotary or linear position encoders for sensing absolute position of a structure over a predetermined range of rotation.

BACKGROUND

Position sensors include devices that generate change to an electronically interrogated physical parameter based on movement of a structure, such as, for example, an actuator shaft operatively coupled to the sensor. For non-contacting sensors, this change is achieved without physical contact to reduce fatigue failures or system degradation due to sensor drag or noise as desired for certain applications. In encoder devices, the physical parameter movement results in the generation of an electronic code representative of position or movement.

In most non-contacting sensor applications, it is often desired that the absolute position of the interrogated structure be provided within a pre-defined measurement range upon the application of electric power. It is also often desired that the position information be accurate and increment in a known linear fashion. Many electronically interrogated non-contacting properties have been applied to achieve such position sensing including, for example, light detection, magnetism, capacitance, inductance, and RF transmission.

In the area of rotary position sensing, particularly over a measurement range of 360 degrees, optical encoders are common. Optically based sensors typically employ an illumination source and an array of reflective or transparent coded segments and corresponding light-sensitive detectors. Optical sensors often suffer from limitations in operating temperature, and susceptibility to contamination and light source aging. In addition, to provide access to position information commensurate with the application of electric power, complicated encoder structures or multiple sensors have resulted that usually increase the cost and overall size of the sensor package. Accordingly, optical solutions are often executed as incremental encoders that count in precise units once a known position is detected within the encoded pattern. This type of sensor generally cannot provide position information with the immediacy desired unless enhanced by electronic memory, a secondary absolute position sensor input, or the like.

Thus, there continues to be a need for further contributions in this area of technology.

SUMMARY

One embodiment of the present invention is a unique sensing technique. Other embodiments include unique methods, devices, systems, and apparatus to sense position. In one form, a non-contacting position encoder includes a multitrack electrode pattern traversed by a capacitively coupled electrode device. In another form one electrode capacitively couples to at least two electrodes of a sensor track separated from one another by an intervening gap. The two electrodes receive voltage waveforms where one is generally an inversion of the other. In still another form of the present invention, a hybrid combination of these forms is provided.

In a further form of the invention, a digital encoder is implemented by using the AC characteristics of capacitive coupling from actively driven, spatially coded segments on a static element to a narrow pickoff on a moving element. In one example, the static element of a rotary sensor contains electrically conductive coded segments with alternating annular TRUE and COMPLEMENT sections arranged radially or transverse to the direction of sensor movement in a multiple-bit Gray code pattern on a non-conductive substrate. The resulting concentric annular ring segments represent the bit sequence for the Gray code representation with either the MSB or LSB located at the inner most ring position and the appropriate segment configuration proceeding in the outward radial sequence. The alternating annular TRUE and COMPLEMENT segments of each bit ring are electrically connected to two common input nodes, one for the TRUE and one for the COMPLEMENT.

The TRUE sections are driven with a positive-going pulse pattern, and the COMPLEMENT sections are driven simultaneously with a negative-going pulse pattern. These pulse patterns are sequentially applied to the radially spaced annular ring patterns in a direction transverse to the direction of movement of the sensor from the MSB toward the LSB, or vice versa. A narrow movable conductive pickoff having a width determined by the intended resolution of the sensor system is held above the stationary encoded pattern and substrate at a fixed distance and extends radially (transverse to sensor movement) from the inner bit ring to the outer bit ring. The combination of the static code segments and the overlapping pickoff surface form two plates of a capacitor and serves as a summing element and position sensing element for capacitively coupled pulses received from the static code segments over which the pickoff lays. Air or some other material between the stationary encoder substrate and the rotating pickoff acts as the dielectric media through which these pulses are capacitively transmitted. The summing action of the pickoff provides a way of edge-sensing that is desired in many implementations. The pickoff signal is connected to processing circuits through capacitive transmitter and receiver plates.

In the rotary sensor embodiment described here, the capacitive transmitter can be realized by a conductive ring concentric with the axis of rotation and attached to one end of the pickoff. A duplicate ring is placed directly across from the rotating ring on the stationary encoder substrate, with each ring forming the plate of a capacitor that is electrically coupled in series with the code/pickoff capacitor structure. The capacitively coupled signal is amplified by the sensor's processing circuits, and the significant pulses are detected with a self-referencing comparator to produce a series of true or false digital signals which, when synchronized with the drive signal applied to the stationary encoder pattern, can be decoded in a synchronized Gray-to-binary conversion circuit for an accurate representation of the moving pickoff structure relative to the stationary encoder structure.

In yet another form of the present invention, the positive and negative going pulses are applied sequentially in time to adjacent conductive patterns of equal size in the sensed direction. The pickoff configuration described in the previous form, modified such that the width is approximately equivalent to one of the adjacent patterns, is used to couple the pulses to a sample-and-hold circuit where the successive amplitudes of the received TRUE and COMPLEMENT pulses are measured. The resulting amplitudes correspond to the relative position, or resulting overlap area, of the pickoff over the TRUE or COMPLEMENT pattern segment. If the TRUE and COMPLEMENT amplitudes are compared ratiometrically, the resulting value will accurately represent the absolute position of the pickoff within the distance defined by the adjacent patterns.

A further embodiment includes a first sensor member defining a number of tracks spaced apart from one another, a second sensor member including a capacitive electrode area, and circuitry including an electrical signal source, logic, and a detection circuit. The tracks are each comprised of capacitive electrode segments spaced apart from one another by corresponding electrically non-conductive gaps. The electrode area of the second sensor member spans across the tracks to correspondingly overlap one or more of the segments of each of the tracks. The signal source generates a signal pattern over a sequence of time periods to provide a changing voltage to each one of the segments in accordance with an established sequence of respective time periods. The electrode area of the second sensor member is capacitively coupled to one or more segments of each of the tracks to detect a sequence of signals emitted in response to the signal pattern. The detection circuit is electrically coupled to the electrode area and the logic of the circuitry. This logic is responsive to the source and the detection circuit to determine information corresponding to position of the electrode area relative to the tracks.

Still a further embodiment includes a sensing device with a face defining a plurality of tracks electrically isolated from one another. One of the tracks includes a first set of electrodes spaced apart from one another by a corresponding set of electrically non-conductive gaps. This set of electrodes includes a first subset electrically coupled to a first electrical node and a second subset electrically coupled to a second electrical node. The electrodes of the first subset and the electrodes of the second subset alternate with one another along the track. In one form, this embodiment includes electrical signal circuitry with a noninverting output coupled to the first node and an inverting output coupled to the second node, and an electrode device positioned opposite the face of the sensing device to capacitively couple to the electrodes of the track.

Still another embodiment includes: generating a signal pattern to repetitively provide a changing voltage to each of two or more tracks of the sensor, capacitively coupling an electrode of the sensor to the tracks to determine a first electrode position along the tracks by detecting a first group of signals emitted in response to the signal pattern, moving one or more of the electrode and the tracks relative to the other to result in a second electrode position along the tracks different than the first electrode position, and detecting a second group of signals emitted in response to the signal pattern with the electrode capacitively coupled to the tracks to determine the second electrode position.

In a further embodiment, a sensor track is provided that includes a first electrode spaced apart from a second electrode by an electrically non-conductive gap. A third electrode is also provided that is positioned opposite the track. A first voltage waveform is applied to the first electrode and a second voltage waveform is applied to the second electrode. The third electrode is capacitively coupled to the track to detect a first signal from the first electrode in response to the first waveform and a second signal from the second electrode in response to the second waveform. Information representative of position of the third electrode along the sensor track is determined as a function of the first signal and the second signal.

Yet another embodiment includes: encoding a first set of bits with a sensor including several sensor tracks and an electrode, where the bits each correspond to a different one of these tracks; applying a first voltage waveform to the first electrode segment of one of the tracks and a second voltage waveform to a second electrode segment of this track, where the segments are spaced apart from one another by an electrically non-conductive gap; capacitively coupling the electrode to the segments to provide a corresponding set of signals in response to the waveforms; and determining a second set of bits as a function of these signals with the sensor, where the first set of bits and the second set of bits represent a sensed position and the first set of bits is numerically more significant than the second set of bits.

A further embodiment includes: providing a sensor with a first member including a first electrode and a second electrode separated form the first electrode by an electrically nonconductive gap between the first electrode and the second electrode, and a second member including a third electrode positioned opposite the first member, sequentially applying a first voltage waveform to the first electrode and a second voltage waveform to the second electrode; capacitively coupling the third electrode to the first member to provide a first signal in response to the application of the first waveform and a second signal in response to the application of the second waveform; and evaluating the first signal and the second signal relative to one another to resolve position of the third electrode.

Another embodiment includes: applying a voltage waveform sequence to a sensor track that includes a first electrode and a second electrode separated by an electrically nonconductive gap, and a third electrode positioned opposite the track; capacitively coupling the third electrode to the first electrode and the second electrode to provide a sequence of detection signals in response to the waveform sequence; processing the sequence of detection signals to provide a comparison of a signal sum and a signal difference; and interpolating position of the third electrode relative to a range along the first electrode, the gap, and the second electrode.

In another embodiment, an apparatus comprises: a sensor face including a track with a first electrode and a second electrode separated from one another by an electrically non-conductive gap; a detection device spaced apart from the track to receive signals form the first electrode and the second electrode by capacitive coupling; and sensor circuitry electrically coupled to the track and the detection device. The circuitry includes means for providing a voltage waveform sequence to the first electrode and the second electrode and means for processing a sequence of detection signals from the detection device in response to the waveform sequence. The processing means includes means for comparing a signal sum and a signal difference to interpolate position of the detection device relative to a range of positions along the first electrode and the second electrode.

A further embodiment includes: providing a sensor track including a first electrode and a second electrode separated form the first electrode by an electrically nonconductive gap between the first electrode and the second electrode, and a third electrode positioned opposite the first member; applying a first voltage waveform to the first electrode and a second voltage waveform to the second electrode, the second waveform being different than the first waveform; and capacitively coupling the third electrode to the track to determine one of two binary states representative of position of the third electrode relative to the first electrode, the second electrode, and the gap.

It is one object of the present invention to provide a unique sensing technique. Alternatively or additionally, another object is to provide a unique method, apparatus, system or device for sensing position. Further objects, forms, embodiments, features, advantages, benefits, and aspects of the present invention will become apparent from the drawings and description contained herein.

DETAILED DESCRIPTION

Figure 1:
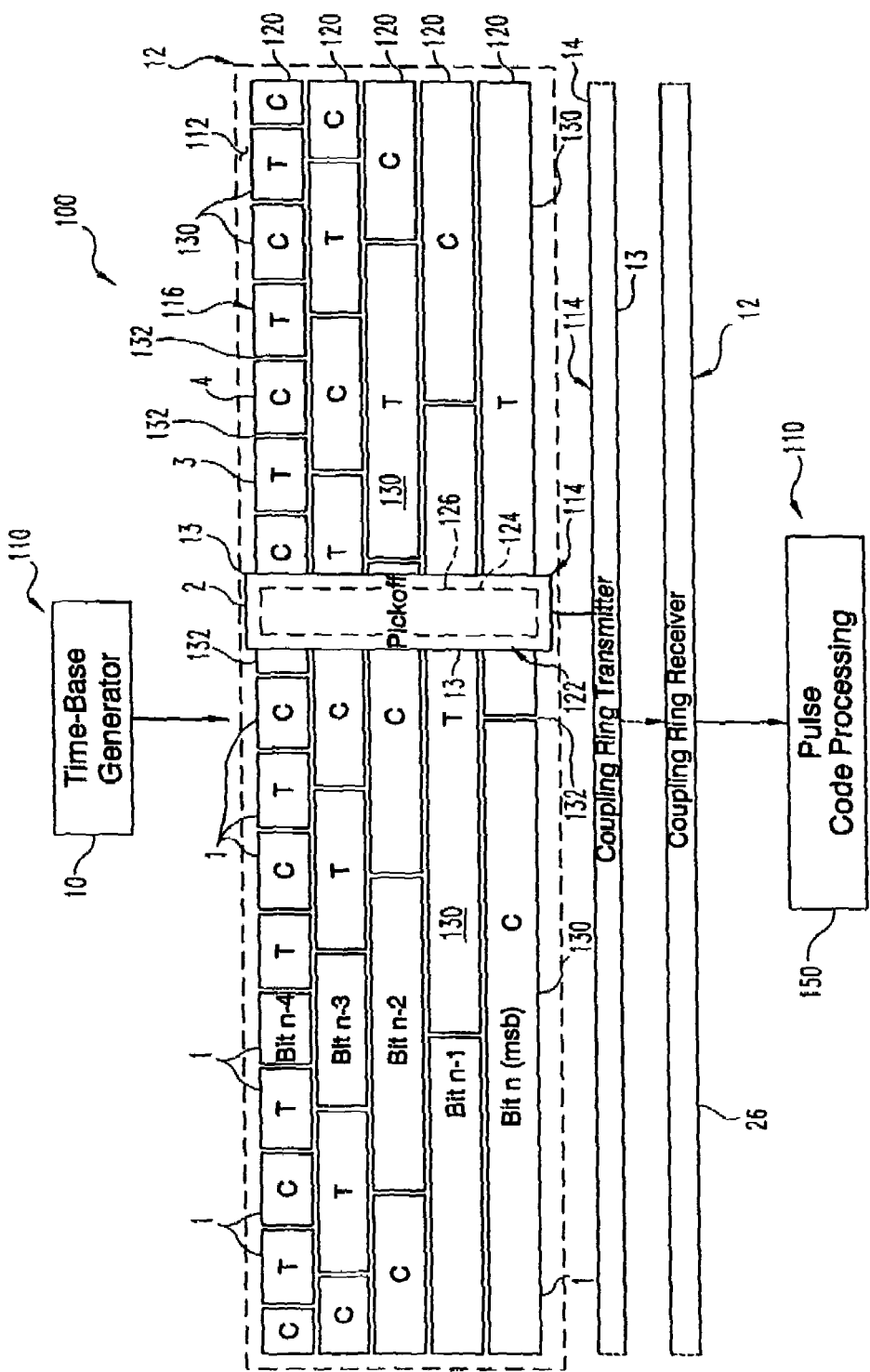
FIG. 1 is a diagrammatic view of a sensor.

For the purposes of promoting an understanding of the principles of the invention, reference will now be made to the embodiments illustrated in the drawings and specific language will be used to describe the same. It will nevertheless be understood that no limitation on the scope of the invention is hereby intended, and that alterations or further modifications of the described embodiments and/or further applications of the principles of the invention as illustrated herein are contemplated as would normally occur to one skilled in the art to which the invention relates.

In one form of the invention, a capacitively coupled position encoder is provided. This encoder detects the position of a capacitive plate on an element relative to coded segments on an opposing element. The movement between encoder elements can be rotary and/or linear. In one arrangement, the digital encoder comprises an absolute position encoder rather than an incremental encoding system. For this arrangement, the system reports the proper position in response to the application of power.

In one implementation, the digital encoder is based on etched printed circuit board technology (PCB) for low-cost production. For one rotary form, the encoder device includes a set of coded angular sectors on one part, such as a stator, to which are applied a sequential pattern of changing voltage pulses. A narrow, capacitively coupled pickoff on a moving part, such as a rotor, overlays the coded sectors, with the pickup and the coded sectors separated by a small air gap or another suitable dielectric medium. As the rotor moves, the pickoff receives different patterns of pulses from the stator, which by the sectored geometry of the encoding method correspond to the angle of the rotor with respect to the stator. The coded arcs on the stator are laid out using a Gray code scheme. The Gray code produces only one bit code transition at a time, avoiding ambiguities that can arise from multi-bit transitions. However, it should be understood that other code formats can be used as would occur to one of skill in the art.

As described above, the rotor contains a narrow radial conductive strip or pointer that overlays the code segments on the stator, with the strip separated from the code segments by a small air gap or another type of dielectric. The angular width of this strip relates to the resolution of the encoder. In this example, a nine bit encoder (512 values) corresponds to a least significant bit (LSB) angular representation that is 360/512 or approximately 0.703 degrees wide. In one Gray code implementation, the smallest segment is twice as wide as an LSB angular sector, or about 1.406 degrees. With regard to this encoder arrangement, it is the edge transitions of the coded elements that tend to determine the sensor resolution. The pickoff width can be up to the same dimension since the position accuracy is determined not by the pickoff width, but by the ability to sense the edge transitions between adjacent TRUE (T) to COMPLEMENT (C) code segments. The pickoff sums the two signals, and when generally centered over the transition, the output changes state.

For patterns defined with PCB etching and/or photolithographic techniques, the accuracy of the system depends on how well edges/transitions are detected, and on the accuracy of the pattern. In one circular disk embodiment of a stator, inner arc segments correspond to the most significant bit (MSB) and outer arc segments correspond to the least significant bit (LSB) (or vise versa), and are sequentially energized with narrow voltage pulses. For this embodiment, a movable pickoff rotor, separated from the stator by an electronically nonconductive gap, picks up the pulses corresponding to the position of the pickoff over the stator code arcs through capacitive coupling. The resulting coded pulse train is coupled back to amplifying and processing circuits on the stator board through adjacent "transmitter" and "receiver" rings on the rotor and the stator. Since the coupling rings are of a generally uniform radius and height around the axis, coupling capacity does not undesirably change with the angle of rotation.

The dimensions of each Gray-coded arc on the stator are sized as a function of radial position for this circular disk embodiment to produce an approximately equal surface area for each bit under the code pickoff. With the equal area for each bit, the received signals are nominally equal in amplitude. In addition to the primary (TRUE) code segments of such stator that are driven with positive-going pulses; alternating segments of equal length are simultaneously driven with negative-going (COMPLEMENT) pulses. The negative pulses correspond to the binary "zero" returns from the coded array, and the positive pulses correspond to the binary "ones" of the coded array. When the pickoff approaches a code transition, it overlays portions of both TRUE and COMPLEMENT code segments. At the capacitively coupled pickoff face, the signals are additive so that at the edge of the code transition from a "zero" to a "one" (or the reverse), the signals cancel. Processing circuits on the stator detect the transition point and correspondingly change the output. A narrow angular footprint of the pickoff provides for generally uniform proportioning of the relative amplitudes of the signals, even with variations in the gap between the stator and rotor as the rotor moves relative to the stator.

The code strip (stator segment) driver circuits produce a series of short, high-frequency logic-level pulses to provide adequate coupling across the small capacities of the stator-to-rotor circuit. The circular coupling capacitor plates for the return signal are designed to be substantially larger in area than any individual pickoff bit signal area to reduce coupling losses back to the detection circuits. The summing action of the sensor pickoff over the spatial pulse pattern generated by the Gray coded TRUE and COMPLEMENT segments enhances accuracy. Each pulse provided to the stator segments is followed by sufficient dead time to allow the pickoff amplifier input stage to settle to a stable level.

In one embodiment of a 9-bit digital encoder, the source of the TRUE pulse train is a logic drive stage producing 0-to-5 volt narrow pulses applied to the TRUE segments of the Gray code arcs. The COMPLEMENT pulse trains are produced in an inverting logic drive stage with 5-to-0 volt negative-going pulses applied to the COMPLEMENT segments of the code arcs. Because the signals are AC coupled over the capacitive link, the signal received at the pickoff amplifier is a train of positive and negative going pulses centered on the local virtual ground. At almost any angle, the pickoff lays over a mix of TRUE and COMPLEMENT code signals. The duty cycle of the pulse train is low so as to accommodate a simple low-pass filter which provides the average level of the pickoff signal, which is applied to the reference input of a high-speed comparator. The amplified TRUE and COMPLEMENT mixed pulse train is applied to the other input of the comparator.

The logic level output of the comparator is loaded into a register stage with a synchronizing pulse generated by the driver timing logic which coincides with the center of the received code pulse. With the synchronized detection, only valid pulse samples are selected, which reduces noise or signal ambiguity. For example, a logical "zero" pulse return is negative, and well below the comparator reference threshold at the time of the synchronization pulse, whereas a logical "one" is positive and substantially above the threshold. In one embodiment, the signal goes through an inverting amplifier before it is applied to the comparator so the signal is inverted. At all other times, the output of the comparator could be ambiguous and may be ignored.

At a code edge transition, both a TRUE and COMPLEMENT pulse from the same code sector radius are coupled by the pickoff into the receiver circuit. The relative magnitude and polarity of the pickoff pulse output changes as the segment edge is passed due to the summing nature of the pickoff element. When the pickoff is generally centered over the edge, the signals cancel one another out The comparator circuit includes a small hysteresis component that produces a sharp state transition at that point. Additionally, the timed sample pulse insures that the valid comparator outputs are applied to the sensor's decoding logic. By structuring the Gray code pulse sequential output with the MSB first, decoding to a binary position word can be performed serially. Using the synchronization pulse as the clock and a recursive sequence through a pair of flip-flops and an exclusive-OR gate, the Gray coded data is converted to binary and loaded into an output register in this embodiment. The combination of the TRUE code segments with their positive-going TRUE pulses and the alternating COMPLEMENT segments with the negative-going COMPLEMENT pulses on the stator tend to cancel out potentially adverse stray coupling.

In one embodiment, the pickoff "receiver" ring on the stator is shielded with narrow guard rings around the inner and outer circumference. The guard rings are connected to a low impedance output of a first stage pickoff amplifier. This amplifier has a noninverting gain of about unity to better match the high impedance capacitive pickoff to the lower impedance processing circuits. By connecting this low impedance output to the guard rings, the rings have about the same signal amplitude as the input, potentially lowering stray capacitance and providing shielding.

In a further embodiment of the invention, the layout and separation of the analog and digital ground circuits are configured to provide large conductive areas to decouple the amplifiers and logic stages. A common connection at a single point is provided at the comparator ground terminal, preferably at the joint DC return of the processing circuits. In the multilayer stator board, a ground shield in interposed between the outer code segments on the face of the stator and the inner layer of driver and receiver circuits. The sequential code pulse generation, synchronizing signals, and the decoding logic can all be incorporated in the routines of a single microcontroller. The amplifiers and comparator are preferably single devices, operating from a common +5.0 volt power supply. The power supply could also be used to power the microcontroller.

In a further embodiment, the digital encoder includes a secondary pickoff having separate coupling rings. The secondary pickoff is spaced at an offset angle which includes an additional half least significant bit offset. With appropriate decoding and processing, this embodiment can double the resolution of the sensor. The secondary pickoff may function as a redundant pickoff for reliability and fault checking/detection. The secondary pickoff can be positioned 180 degrees out of phase (or at any other convenient phase angle) relative to the primary pickoff, and the fixed offset can be subtracted to produce an output that substantially matches the primary pickoff. If the outputs of the primary and secondary pickoffs do not match, a warning could be issued. In another embodiment, three pickoffs could be utilized, and a two-out-of-tree output signal vote could be used to ensure a valid output.

In a further embodiment, only the primary TRUE Gray code segments on the stator are implemented, alternating with a ground plane. This technique can be used with a dual pickoff arrangement. The primary TRUE pickoff could comprise a straight radial element with the secondary COMPLEMENT pickoff using small area segments which are interconnected and spaced to lay over the corresponding COMPLEMENT positions for each bit relative to the stator code segments. The outputs of the two pickoff channels may be combined in the amplifiers so that the TRUE and COMPLEMENT signals cancel at the code segment edge transitions to provide a sensing result similar to the system described above.

Figure 13:
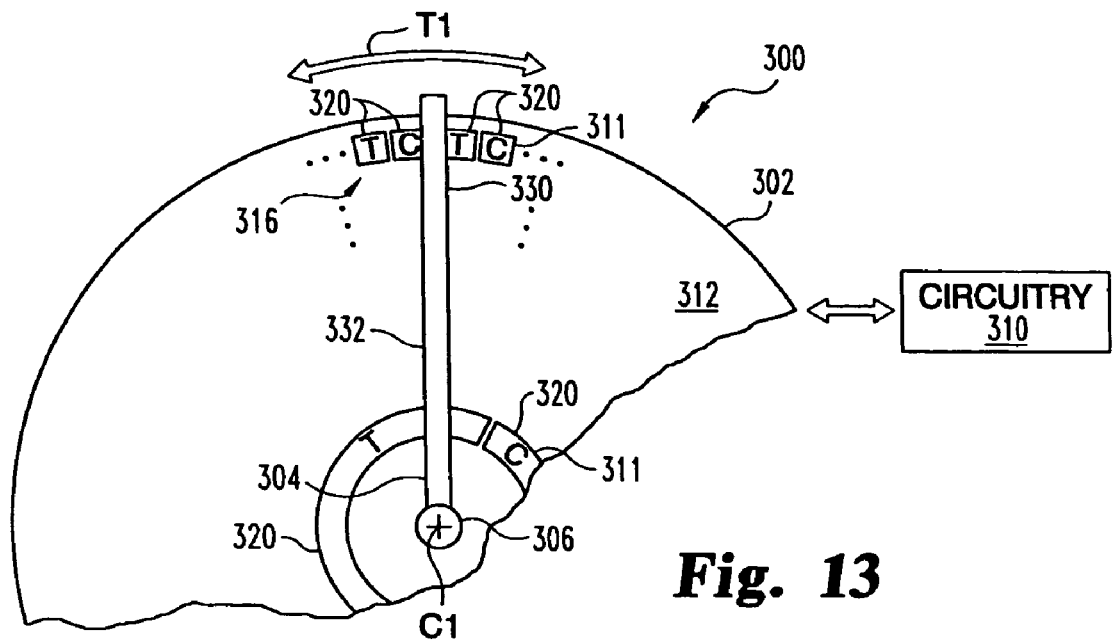
FIG. 13 is a partial diagrammatic view of yet another type of sensor.

Having described various components and features associated with several embodiments of digital encoders falling within the scope of the present invention, reference will now be made to embodiments illustrated in FIGS. 1-9. One embodiment of a non-contact encoder and encoding technique is described in connection with sensor 100 of FIG. 1. Sensor 100 includes circuitry 110 connected to sensor face 112 and detection device 114. The illustrated technique is based on applying a sequence of time-based pulses from a digital signal generator 10 of circuitry 110 to a set of conductive plates 1 arranged in a Gray code binary pattern 116 of tracks 120 carried on a fixed surface of face 112. Only a few plates 1 are designated by reference numerals to preserve clarity. Circuitry 110 also includes pulse code receiving and processing circuit 150. A suitably dimensioned narrow pickoff 2 is mounted on rotor member 13 that moves relative to code pattern 116 carried on stator member 12. Pickoff 2 is separated from code pattern 116 by a small electrically nonconductive gap 122. Pickoff 2 defines face 224 positioned opposite face 112. Face 124 defines an electrically conductive electrode 226 that extends across tracks 120 generally transverse to the direction of relative movement between face 112 and face 124. While being schematically represented in a linear fashion in FIG. 1, pattern 116 is physically arranged in an approximately circular pattern, as shown in the embodiment of FIG. 13 described in greater detail hereinafter. For this arrangement, tracks 120 can be concentrically oriented about a pivot point with rotor member 13 (including pickoff 2) being configured to rotate about this point as it scans tracks 120. Nonetheless, in other embodiments various features, such as pattern 116, tracks 120, and pickoff 2, can be differently arranged.

The pickoff 2 receives pulses capacitively coupled from the code segments that lie beneath the position of the pickoff 2. The code strips, in addition to being divided into binary weighted areas, such as Bit n (MSB), Bit n−1, etc., are divided into TRUE (T) and COMPLEMENT (C) sectors 3, 4. The TRUE and COMPLEMENT sectors 3, 4 in turn correspond to ones and zeros of a digital code signal. In one embodiment, the TRUE pulse signals are positive-going while the COMPLEMENT pulse signals are negative-going. However, it should be understood that other configurations are also contemplated.

Figure 2:
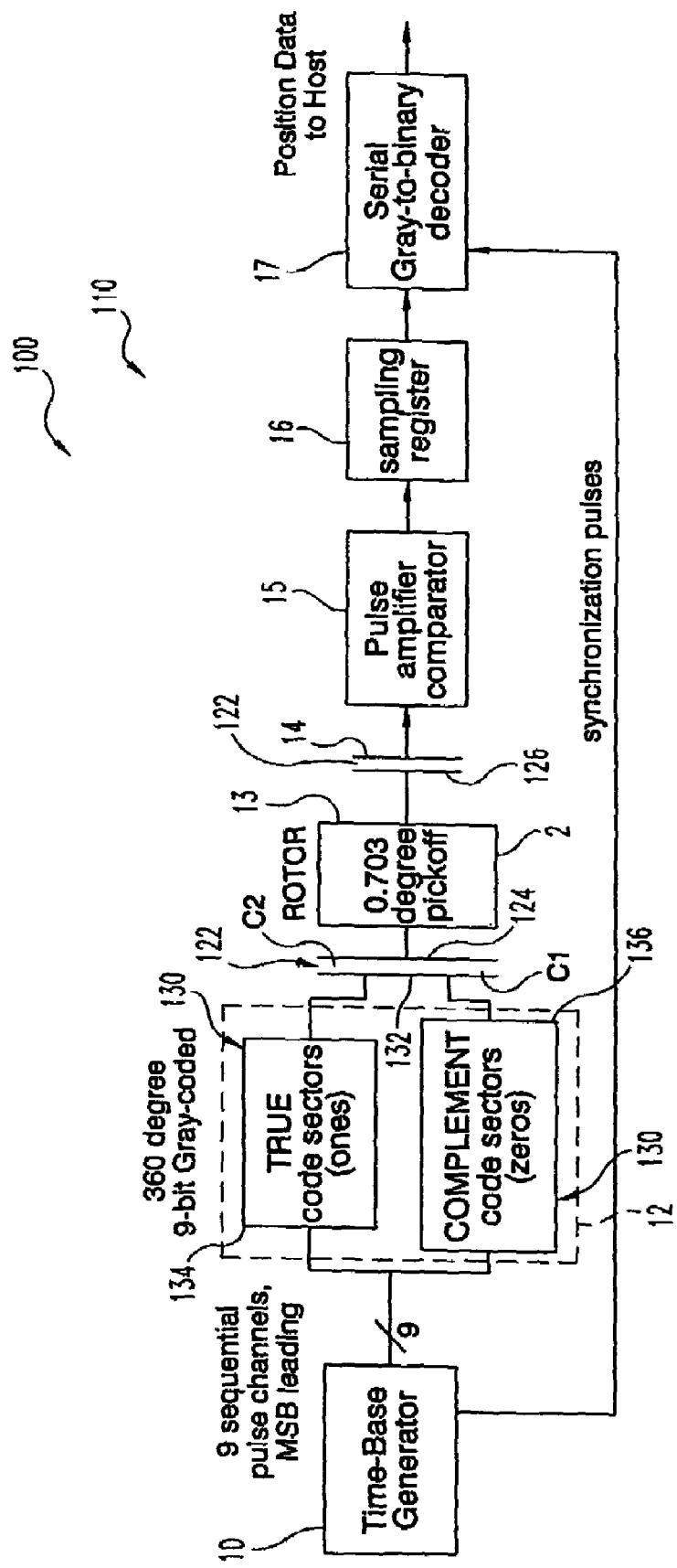
FIG. 2 is a diagrammatic view including selected aspects of circuitry of the sensor of FIG. 1.

Referring particularly to FIG. 2, tracks 120 are segmented into arcuate electrode segments 130, only a few of which are designated by reference numerals to enhance clarit; and that are the same as plates 1 in this embodiment. In FIG. 2, like features represent like reference numerals previously described in connection with FIG. 1. Segments 130 are each comprised of an electrically conductive material that are spaced apart from one another along a given track 120 by a corresponding one of electrically nonconductive gaps 132. In one form, segments 130 are formed along face 112 from a metallization layer using standard photolithographic techniques.

Electrode segments 130 are comprised of a subset of TRUE (T) electrodes 134 and a subset of COMPLEMENT (C) electrodes 136 that are the same as sectors 3 and sectors 4, respectively. As detection device 114 moves along tracks 120, electrodes 134 and 136 in close proximity to device 114 capacitively couple with electrode 226 of pickoff 2. This capacitive relationship is schematically represented as parallel capacitances C1 and C2 in FIG. 2.

Through this capacitive coupling with tracks 120, pickoff 2 performs a summing function, effectively combining the sequential bit pulses into a bipolar serial pulse train corresponding to the Gray code, and representing position of device 114 along tracks 120. Signal coupling plate rings 14 return the pulse train back to amplifier-comparator circuits 15 of circuitry 110. When the pickoff 2 overlaps a particular set of simultaneous TRUE and COMPLEMENT pulse sectors 3, 4, (or electrodes 134 and 136), the larger signal will dominate. When the pickoff 2 is generally centered over one of gaps 132 and between sectors 3 and 4 (electrodes 134 and 136), the pulses will be approximately equal and the sum is approximately equal to zero. This summing operation in conjunction with alternately positive and negative pulses provide sensor 100 with digital encoding of a relatively high degree of accuracy and precision. In one arrangement, the width of the smallest (of segments 130 of pattern 116) is approximately equal to twice the size of the least significant bit of the sensor output. This setup is characteristic of the Gray code, which is sometimes referred to as reflected binary. The pickup 2 can also define a width that is twice the size of the least significant bit.

Referring to the block diagram of FIG. 2, digital time-base generator 10, which provides the pulse generation and timing for sensor 100, Gray-coded TRUE and COMPLEMENT electrodes 134 and 136 associated with stator 12, a narrow 0.703 degree pickoff 2 associated with rotor 13, capacitive feedback coupling rings 14, an analog pulse amplifier and comparator 15, a synchronized digital sampling register 16, and a digital serial Gray-to-binary decoder 17 are illustrated in schematic form.

Figure 3:
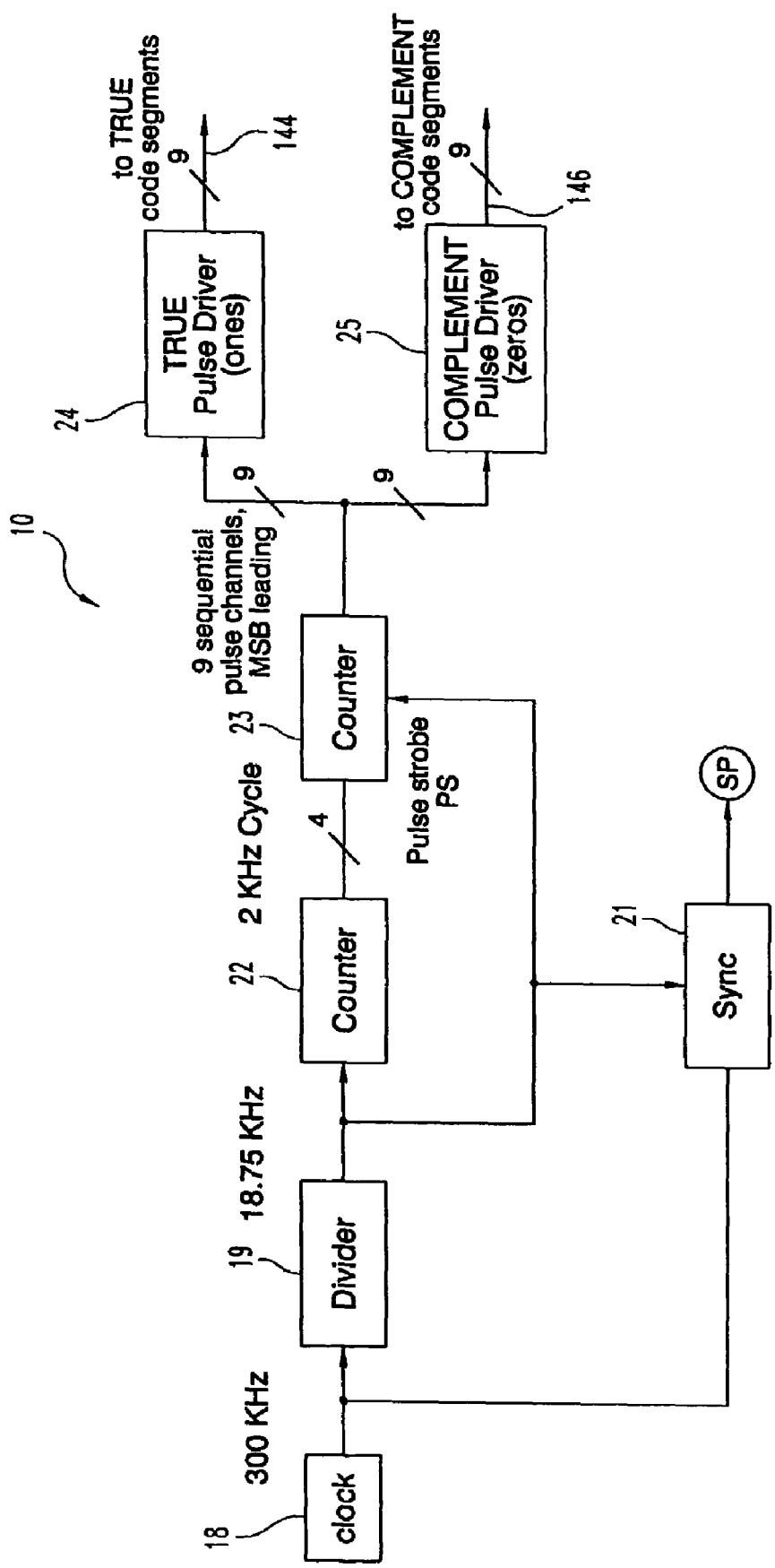
FIG. 3 is a diagrammatic view showing further details of the time-base generator shown in FIGS. 1 and 2.

Referring to FIG. 3, illustrated therein is one form of time-base generator 10. Generator 10 can be implemented with custom logic, a general-purpose microcontroller with application specific firmware, and/or using different techniques as would be known to those skilled in the art. Generator 10 includes clock oscillator 18 which is used to generate pulses by dividing its output down to a lower frequency with duty-cycle timing for the pulse sequence. A first counter-divider 19 determines the timed spacing between the pulses and generates the low duty-cycle pulse strobe PS applied to the succeeding stages. A synchronizing circuit 21 generates a delayed strobe pulse SP. A second counter-divider 22 has nine states, with four line outputs defining the nine successive bits of the sensor's position-determining signal. The four-to-nine line decoder 23 is gated by signal PS from divider 19 to provide nine sequential pulsed signals having a duty cycle determined by the ratio of the clock 18 period and the first divider stage 19. Because the received pulse signals typically have a trailing edge overshoot and need time to settle back to a reference level, a low duty cycle is generally desired. The nine parallel outputs of counter 23 are applied to a nine-bit parallel linedriver stage 24 which are each connected to the TRUE segments 130 of a different one of tracks 120. The pulse trains are also applied to a nine-bit inverting parallel line driver stage 25 which are each connected to the COMPLEMENT segments 130 of a different one of tracks 120. Accordingly, all the TRUE electrodes 134 for a given track 120 are coupled together at the same noninverting electrical node 144 of a corresponding one of the nine outputs of driver 24. For each different track 120, all the COMPLEMENT electrodes 136 of a given track 120 are coupled together at the same inverting electrical node 146 of a corresponding one of the nine outputs of driver 25.

Figure 4:
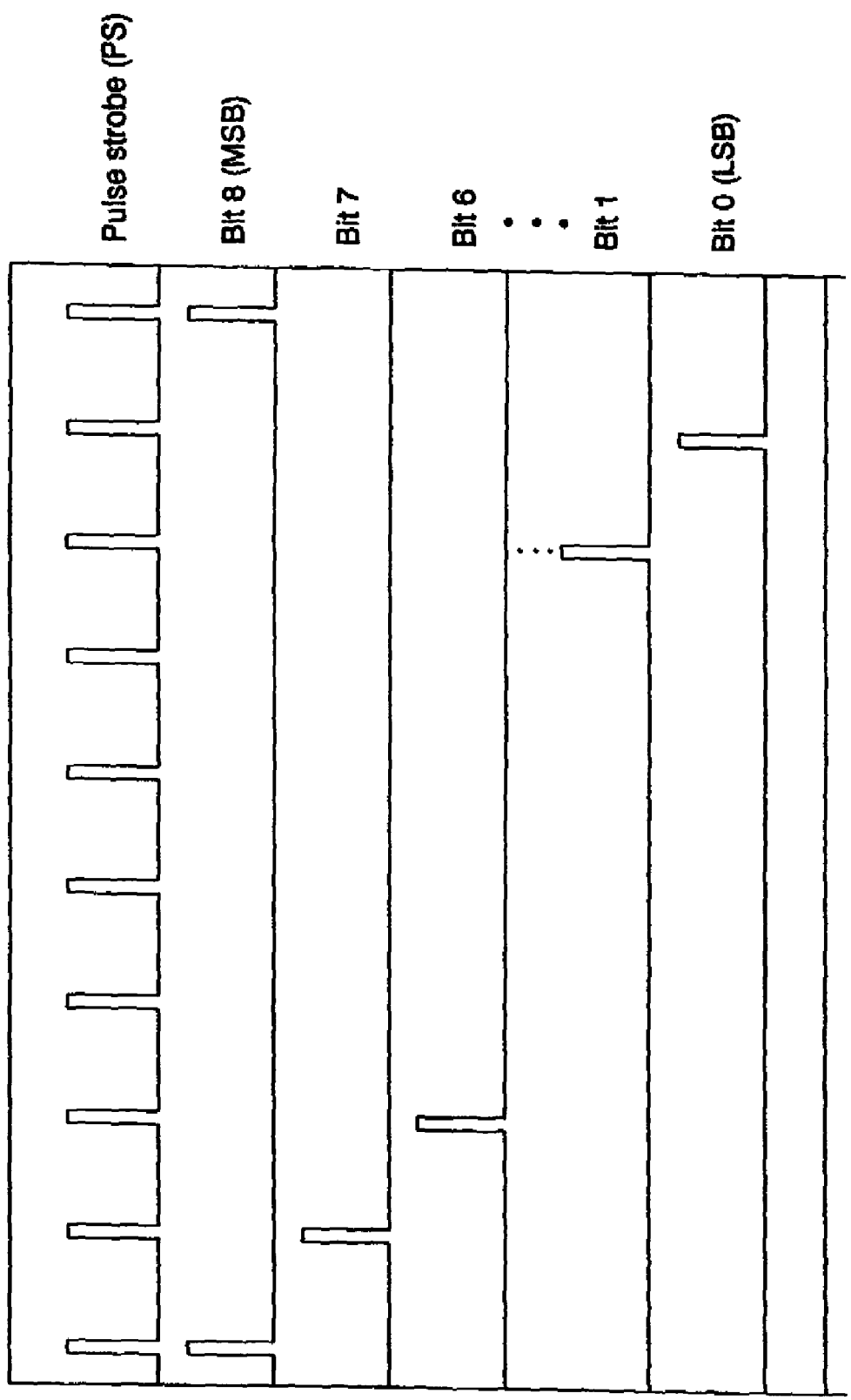
FIG. 4 is a timing diagram illustrating the generation of changing voltage pulses with the generator of FIGS. 1-3.
Figure 5:
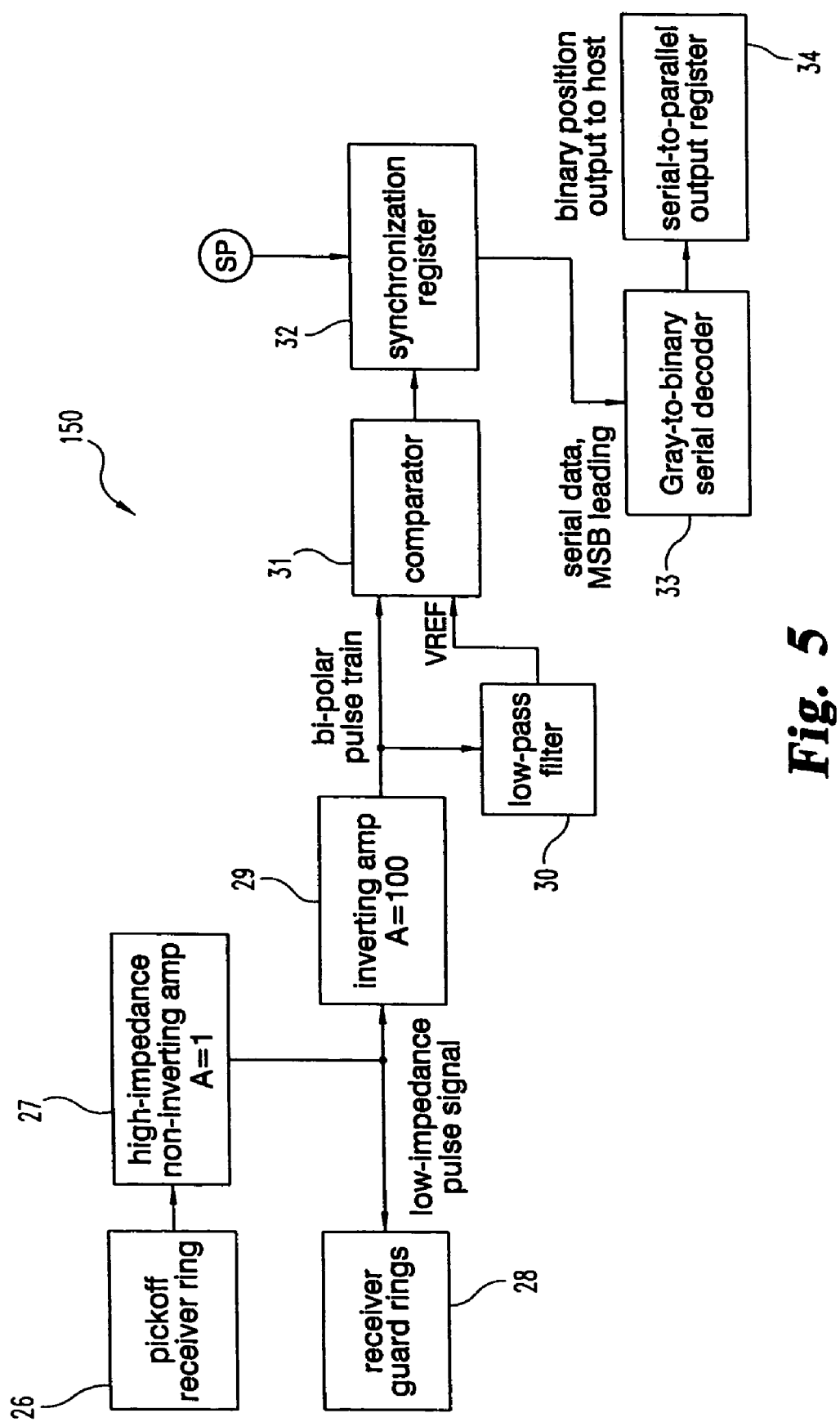
FIG. 5 is a diagrammatic view of a processing circuit included in the sensor of FIG. 1.

Referring to FIG. 4, shown therein is a graph illustrating code pulse timing with the pulse strobe PS and selected sequential outputs applied to the pulse drivers 24 and 25. Ellipses are used to represent the pulses between Bit 1 and Bit 6, which follow a like pattern from left to right. Referring to FIG. 5, shown therein is a block diagram of processing circuit 150, from the pickoff receiver coupling ring 14 of stator 12 to the binary position output register 34. The capacitively coupled transmitter ring 14 of rotor 13 and receiver ring 26 of stator 12 provide a generally uniform coupling capacity, independent of rotary position between rotor 13 and stator 12. The low-level, high-impedance signal from ring 26 is converted to a low-impedance signal in the non-inverting unity-gain first stage amplifier 27. This low-impedance output is applied to the conductive guard rings 28 that surround the receiver ring 26 to minimize local parasitic capacity that could degrade the amplifier input and further isolate the amplifier output from undesirable stray signals under certain conditions. The output is AC coupled to second stage inverting amplifier 29 which provides gain sufficient to bring up the signal amplitude to a useful level for comparator stage 31 of circuitry 150. The AC coupling reduces the effects of DC offset from the high impedance first stage amplifier 27. Additionally, the output of the amplifier 29 is applied to a low-pass filter 30, which generally attenuates the pulses in the signal stream, thereby leaving only the average DC level for use as the comparator 31 input reference voltage, VREF.

The pulse train is bipolar due to the nature of the AC coupling of the capacitive link from segments 130 to pickoff 2. At this point in the circuit, the TRUE pulse returns are negative and the COMPLEMENT pulse returns are positive. The digital level outputs of the comparator 31 are applied to a single bit synchronization register 32 and are loaded into register 32 on the rising edge of pulse SP from the time-base generator 10. Pulse SP is positioned in time to coincide with the center of the received TRUE or COMPLEMENT pulse signals. For example, as pickoff 2 passes from a TRUE code region to a COMPLEMENT code region, the summing action of pickoff 2 generates an output signal from the second stage amplifier 29 that changes from a negative to a positive pulse relative to the reference voltage at the input to the comparator 31. The comparator output changes correspondingly during that pulse signal time when it is loaded into synchronization register 32. The serial digital signal from the synchronization register 31, which is in Gray code format (MSB leading), passes through a Gray-to-binary decoding stage 33 and is then shifted into a 9-bit parallel output stage 34 at the next MSB pulse time when the conversion is complete. The MSB timing pulse is provided by the sequential pulse decoder 23 in the time-base generator 10 of FIG. 3.

Figure 6:
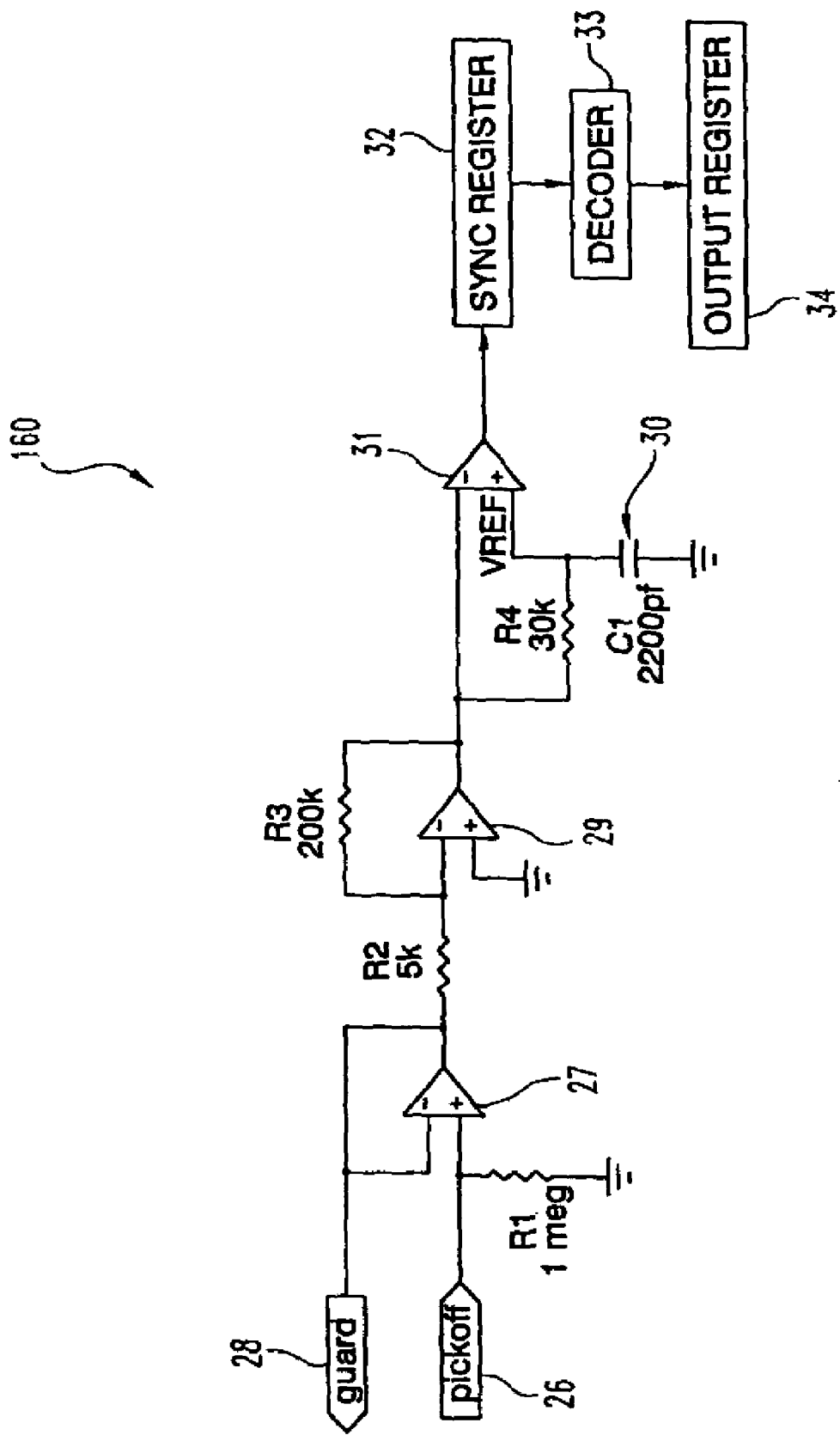
FIG. 6 is a schematic diagram further illustrating one implementation of the circuit of FIG. 5.

Referring to FIG. 6, shown therein is a schematic of pickoff amplifier circuitry 160; where like reference numerals refer to like features previously described. Circuitry 160 includes non-inverting high impedance unity gain first stage 27, the second stage inverting amplifier 29 with a gain of 40, and the low-pass filter 30 which provides the reference voltage VREF for the comparator 31, of which one implementation is shown in greater schematic detail in FIG. 6. Synchronization register 32, decoder 33, and output register 34 are also shown.

Figure 7:
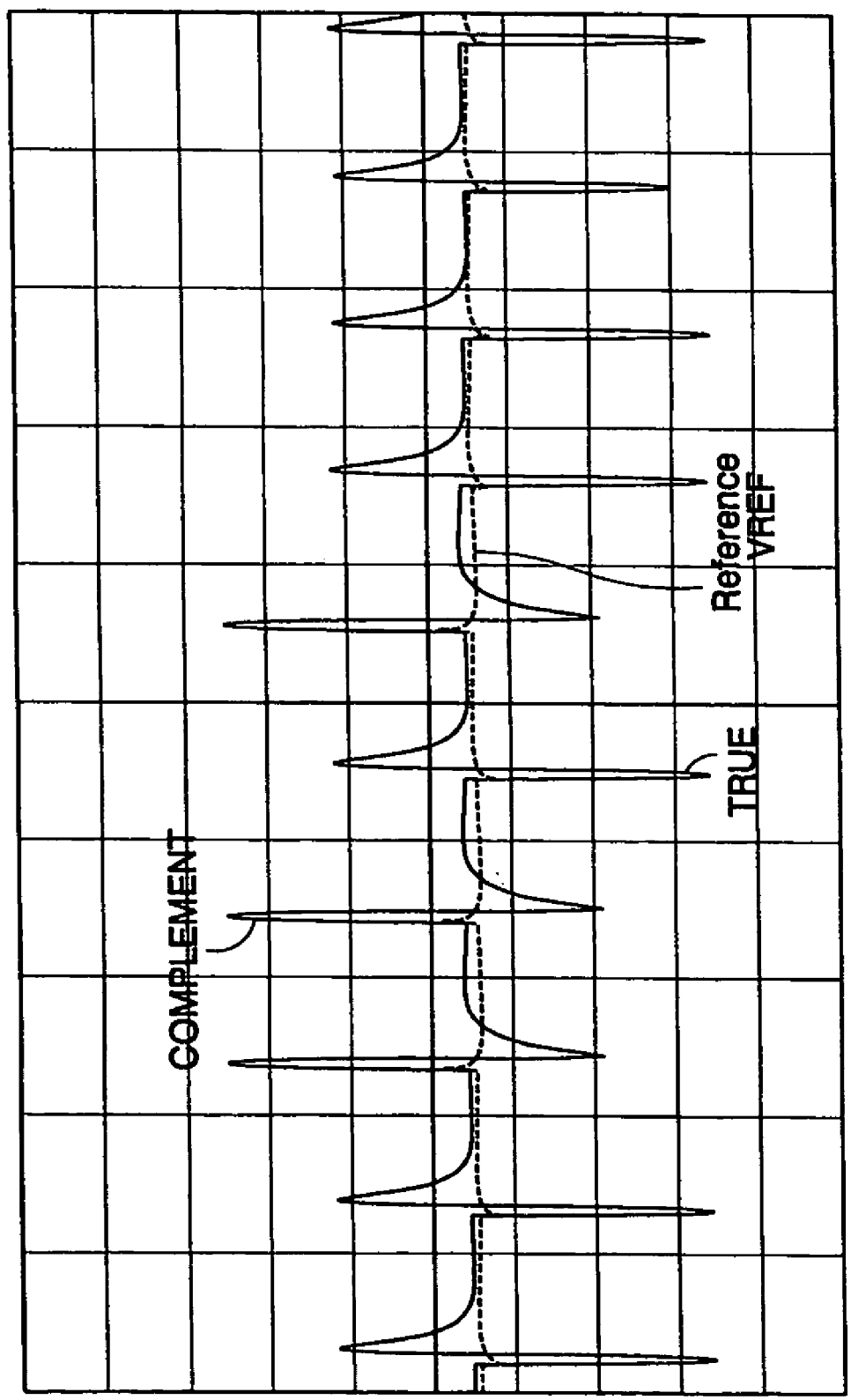
FIG. 7 is a timing diagram showing inputs to the comparator of FIG. 6.

In FIG. 7 a simulated oscilloscope representation of the second stage pickoff amplifier output is shown with a typical signal pattern. Positive-going COMPLEMENT pulses are shown as are the negative-going TRUE pulses in a primary trace represented by a solid line. A secondary trace represents the filtered REFERENCE level represented in a dashed line pattern. The typical pulse overshoot is also shown as well as the settling time as the signal returns to the nominal average level. The duty cycle of the pulse train is selected to allow the signal to stabilize after each pulse. The FIG. 7 illustration corresponds to the implementation shown in FIG. 6.

Figure 8A:
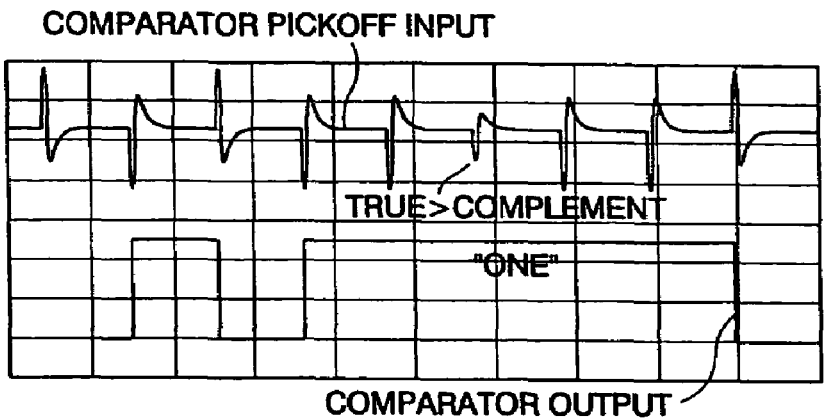
FIGS. 8A-8C illustrate different outputs of the comparator of FIG. 6 for different input conditions.
Figure 8B:
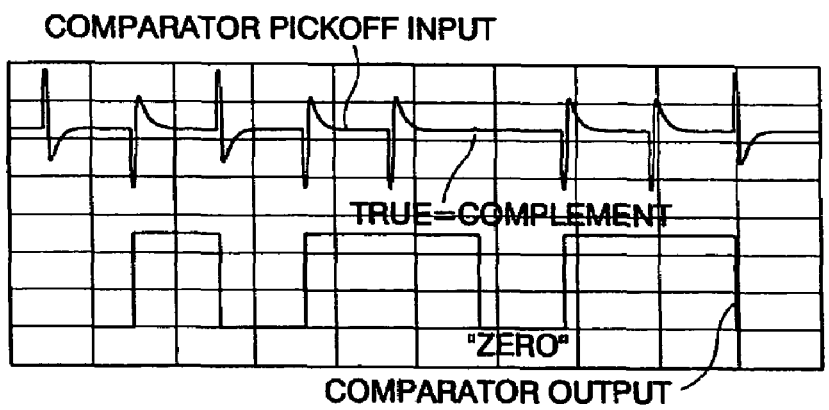
Figure 8C:
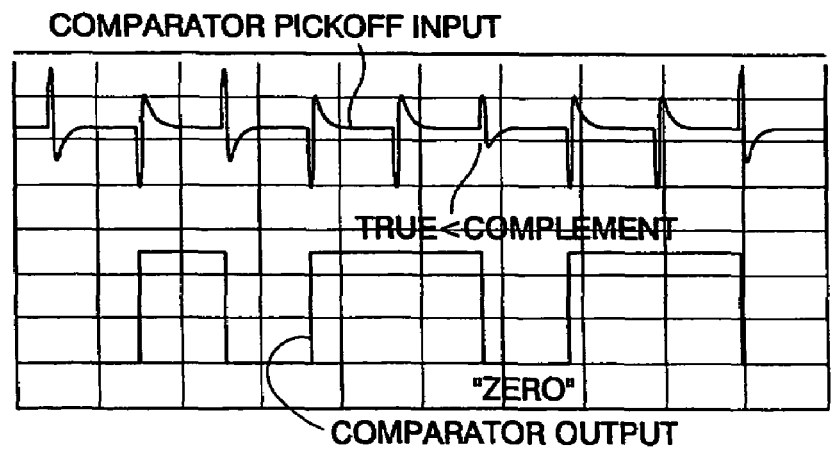

Referring to FIGS. 8A, 8B and 8C, shown therein are simulated oscilloscope representations of a signal pattern as one bit is passing through the transition from a TRUE state to a COMPLEMENT state, and also showing the resulting sampled output. In FIG. 8A, the TRUE signal is larger than the COMPLEMENT component (TRUE>COMPLEMENT). The signals are additive so there is still enough TRUE signal to generate a digital "one" output at that time. In FIG. 8B, the COMPLEMENT signal is generally equal to the TRUE signal (TRUE=COMPLEMENT), the comparator 31 is biased to switch states at that level, and the output switches to a digital "zero". In FIG. 8C, the COMPLEMENT is substantially larger than the TRUE signal (TRUE<COMPLEMENT), and the output is a digital "zero".

Figure 9:
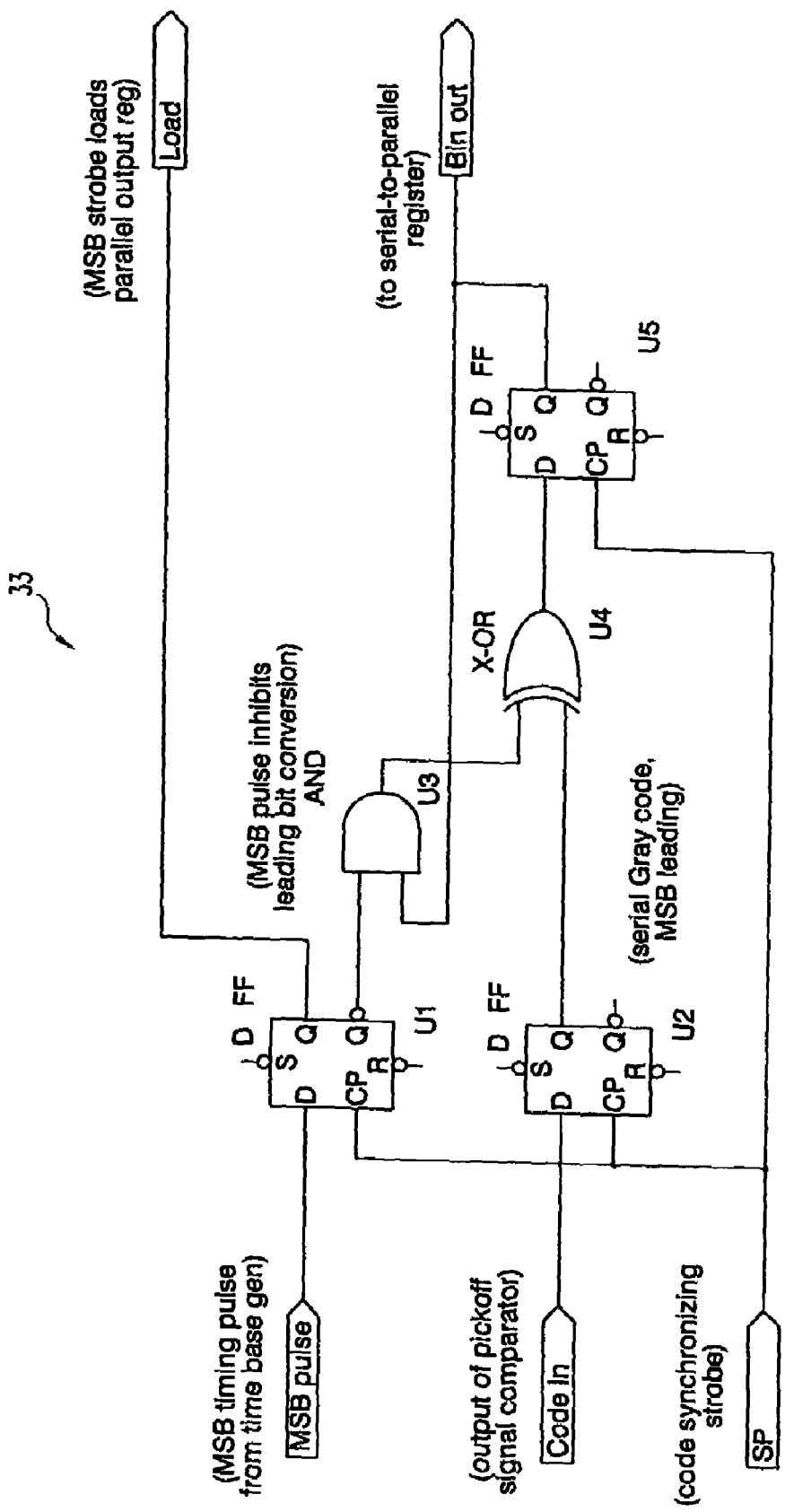
FIG. 9 is a schematic circuit diagram illustrating one implementation of the synchronization register and decoder shown in FIGS. 5 and 6.

Referring to FIG. 9, shown therein is a schematic of logic implementing Gray-to-binary decoder 33. The inputs are the MSB timing pulse from the pulse generator 23, the pickoff comparator 31 output signal, and the bit-synchronizing strobe pulse SP. The output is in the form of serial 9-bit binary words for loading into a serial-to-parallel register stage 34. This logic includes D flip-flops U1, U2, and U5; two-input AND gate U3 and two-input exclusive OR (XOR) gate U4.

Figure 10:
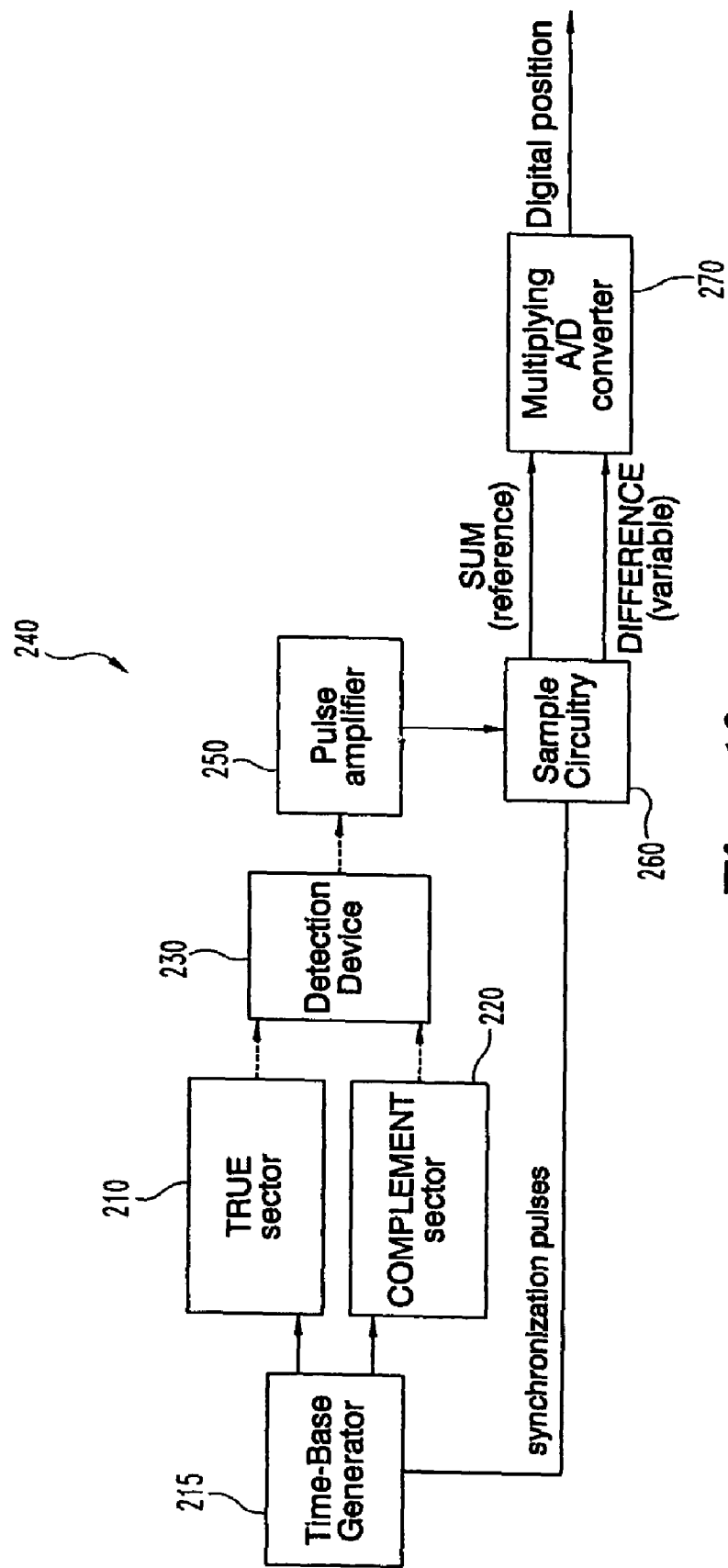
FIG. 10 is a diagrammatic view of another type of sensor.
Figure 11:
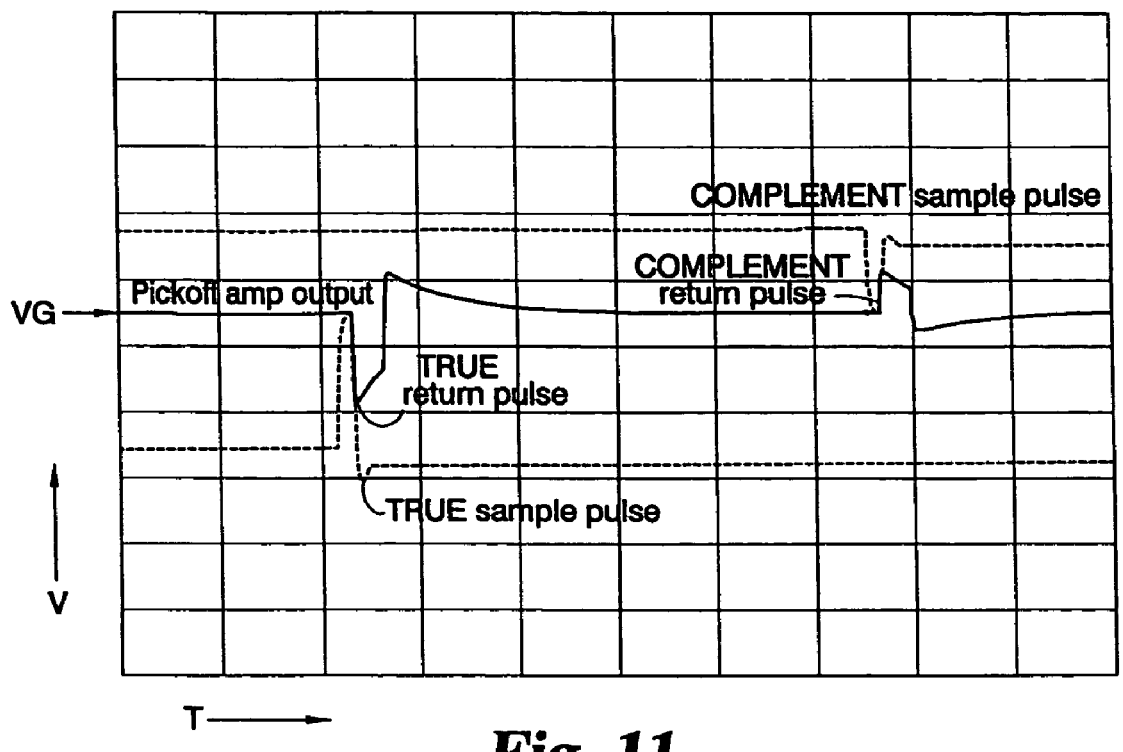
FIG. 11 is a comparative timing diagram illustrating the operation of the sensor of FIG. 10.
Figure 12:
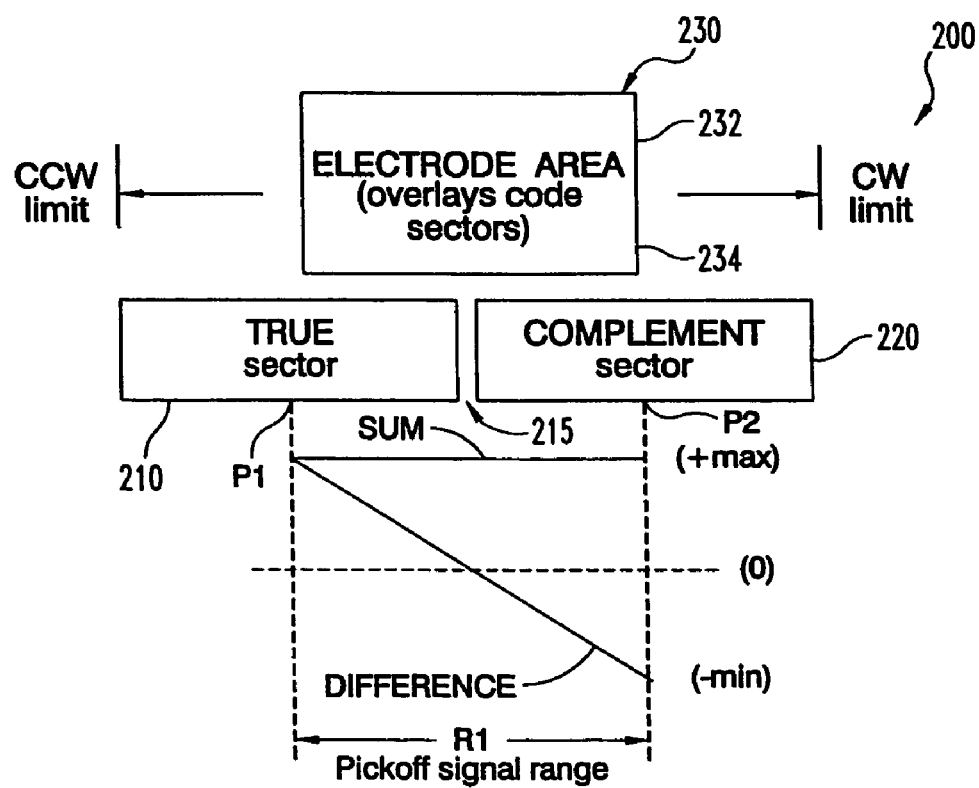
FIG. 12 is a schematic diagram representing still other aspects of the sensor of FIG. 10.

Referring to FIGS. 10-12, shown therein is a ratiometric sampled pulse capacitively coupled position sensor 200 of another embodiment. An analog vernier encoding system for a limited range absolute position sensor adopts aspects of the pickoff and TRUE/COMPLEMENT code sector technique previously described in connection with FIGS. 1-9. It has been discovered that the pickoff amplifier's pulse amplitudes respond in a relatively linear fashion as pickoff 2 passes across the TRUE and COMPLEMENT sector boundaries. Sensor 200 includes TRUE code electrode sector 210 and COMPLEMENT electrode sector 220 that can be the same as TRUE and COMPLEMENT electrodes 134 and 136, respectively. Sensor 200 also includes detection device 230 with pickoff electrode 232 having electrode area 234 (See FIG. 11). The range of sensor 200 extends from about the center of TRUE sector 210 to about the center of COMPLEMENT sector 220, with pickoff electrode 232 being less than or equal to sector width.

Sensor 200 further includes timing logic 240. Timing logic 240 sequentially generates a narrow positive-going TRUE pulse and a narrow negative-going COMPLEMENT pulse. These pulses are applied to the designated sectors 210 and 220 in sequence. As shown in FIG. 11, the pickoff acts as a summing element for the return pulses from the code sectors. The pickoff pulse signal amplifier 250 is similar to the configuration used for pickoff 2 of sensor 200. In one embodiment, the position sensor includes two fast analog sample-and-hold circuits with additional sum and difference amplifiers (sample circuitry 260) for analog signal processing and a multiplying analog-to-digital (A/D) converter 270, which outputs a distance value corresponding to position. The pickoff's summing action provides a "vernier" type interpolation by sampling the amplitude of the received pulse as it moves across the TRUE and COMPLEMENT sectors 210 and 220 electrically separated by gap 215. At the output of the pickoff inverting gain amplifier, the pulse reaches its peak positive amplitude when the pickoff is fully over the COMPLEMENT segment, and the peak negative amplitude when it is fully over the TRUE segment. The TRUE pulse return is individually sampled and held until the COMPLEMENT pulse is sampled. Then both signals are applied to SUM and DIFFERENCE amplifiers of circuitry 200 to provide inputs to multiplying A/D converter 270.

The SUM (TRUE+COMPLEMENT) signal is applied as the reference voltage to the A/D converter and the DIFFERENCE (TRUE−COMPLEMENT) signal is the converted variable. By referencing the conversion with the SUM signal, the ratiometric nature of the conversion retains the absolute value of the displacement, independent of mechanical or environmental influences. The output of converter 270 is applied to a processor or controller (not shown) for further processing and/or transmittal to an application host (not shown).

In another embodiment, simultaneous bi-polar pulses are applied to both the TRUE and COMPLEMENT sectors followed by simultaneous positive pulses to both sectors. This alternative interpolation technique incorporates the SUM and DIFFERENCE function into the inherent summing property of the pickoff. The sampled SUM and DIFFERENCE signals could then be applied directly to the A/D converter. Using either of these vernier interpolation voltage waveform sequences, position is resolved to one of several possible locations relative to a range R1 extending from a point P1 on TRUE sector 210 to a corresponding point P2 on COMPLEMENT sector 220, as symbolically represented in FIG. 12. In one preferred form, position is resolved to one of at least four positions along range R1. In a more preferred embodiment, position is resolved to one of at least eight positions (3 bits) along range R1. In an even more preferred embodiment, position is resolved to at least one of 64 positions (6 bits) along range R1.

In still another embodiment, the arrangement of sensor 100 is used to provide a multiple bit sensed position value and the vernier interpolation technique described in connection with sensor 200 is utilized relative to the segments 130 of the least significant bit (LSB) track 120 overlapped by pickoff 2. This LSB track vernier interpolation provides a second set of bits that enhances resolution while using the same sensor face 112 and detection device 114 for both techniques. For this arrangement, signal processing includes the operating logic and/or circuitry 110 to implement the sensing technique of sensor 100; and the operating logic and/or circuitry 240 to implement the sensing technique of sensor 200. For example, sample circuitry 260 and converter circuitry 270 can be added to the sensor 100 to perform vernier interpolation on the LSB track with appropriate pulse sequence adaptation along with the multitrack position sensing already provided by sensor 100. Accordingly, for a sensor arrangement combining the approaches of sensor 100 and sensor 200, position can be collectively defined with two sets of bits: a first set with each bit corresponding to a different track, and a second set with each bit being determined relative to a particular TRUE and COMPLEMENT pair of electrodes on the LSB track.

Figure 14:
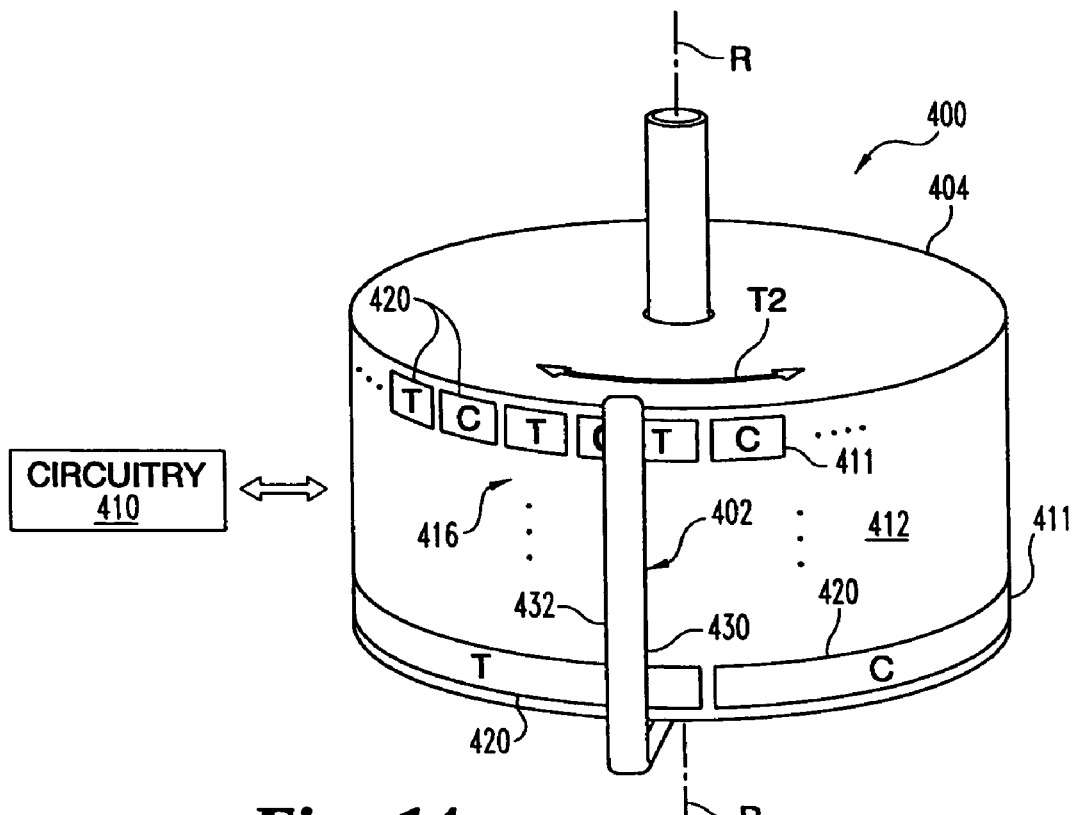
FIG. 14 is a partial diagrammatic view of still another type of sensor.
Figure 15:
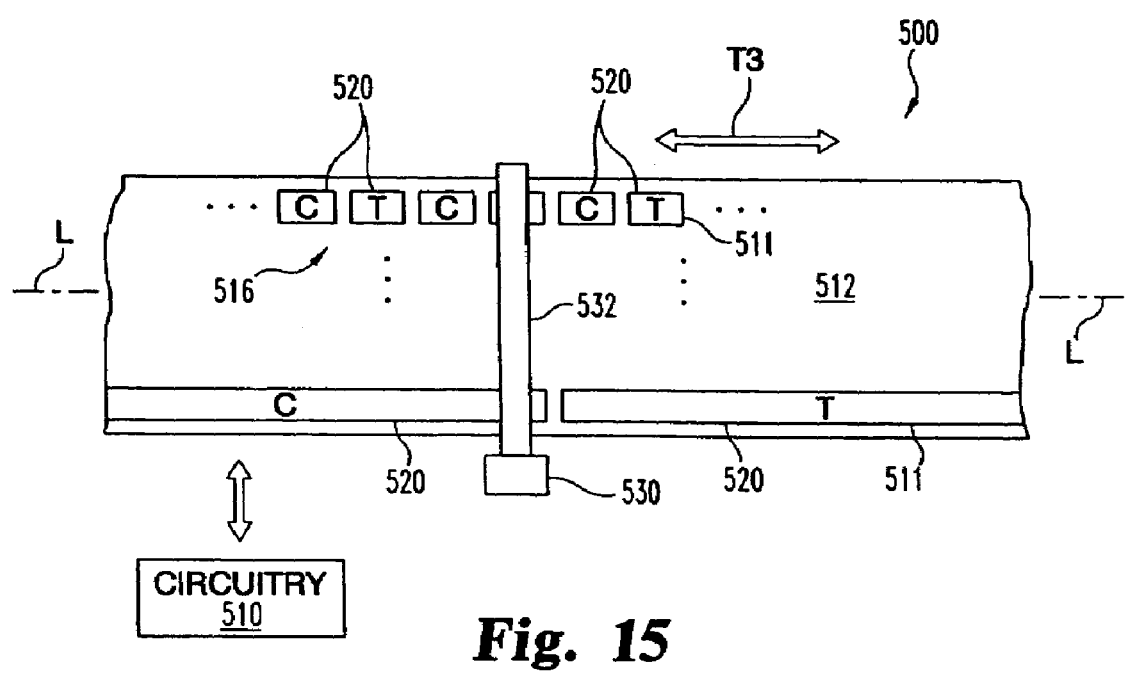
FIG. 15 is a partial diagrammatic view of a further type of sensor.

Referring to FIGS. 13-15, several alternative implementations of this approach are described in terms of different physical arrangements. FIG. 13 illustrates disk sensor 300 including a stator 302 and a rotor 304 journaled together by rotational coupling 306. Rotor 304 turns about pivot axis C1 which is represented by crosshairs because it is perpendicular to the view plane of FIG. 13. Circuitry 310 includes aspects of circuitry 110 and 240 to perform the combined techniques thereof as previously described. Specifically, a coarse position measurement is defined by a first set of bits where each bit corresponds to a different one of the tracks and a more refined, least significant value is determined using the vernier interpolation technique of sensor 200 as represented by a second set of bits less significant than the first set. It should be appreciated that this second set of bits is determined from a single track, the LSB, using the sensor 200 processing approach.

Sensor 300 includes circular segmented tracks 311 on sensor face 312. Tracks 311 are concentric with respect to one another and axis C1. Tracks 311 define Gray code electrode pattern 316 of alternating TRUE and COMPLEMENT arcuate electrodes 320. Ellipses are used to represent portions of the pattern elements that are not specifically shown in FIG. 13 to preserve clarity. Pattern 316 generally appears the same as that schematically shown in FIG. 1, with a circular shape. Sensor 300 also includes detection device 330 that has detection electrode 332 extending across tracks 311. Electrode 332 capacitively couples to electrodes 320 in the manner previously described in connection with sensors 100 and 200. Specifically, detection device 330 is carried as part of rotor 304 while stator 302 carries face 312. Device 330 and tracks 311 move relative to one another in the directions indicated by double-headed arrow T1. Detection device 330 and electrode pattern 316 are electrically coupled to circuitry 310 to operate with the combined features of sensor 100 and 200, as previously described.

FIG. 14 illustrates cylindrical sensor 400 including stator 402 and rotor 404 journaled together by a rotational coupling (not shown). Rotor 404 turns about rotational axis R. Circuitry 410 is also included that combines aspects of circuitry 110 and 240 to integrally perform the collective techniques previously described in connection with sensor 300. Sensor 400 includes circular, segmented tracks 411 on sensor face 412. Tracks 411 approximately each have the same radius relative to axis R and the same path length thereabout. Tracks 411 define Gray code pattern 416 of alternating TRUE and COMPLEMENT arcuate electrodes 420. Ellipses are used to represent pattern elements that are not specifically shown to enhance clarity. Sensor 400 also includes detection device 430 that has detection electrode 432 spanning across tracks 411. Stator 402 carries detection device 430 while face 412 is carried with rotor 404. Device 430 and tracks 411 move relative to one another in the directions indicated by double-headed arrow T2. Detection device 430 and electrode pattern 416 are coupled to circuitry 410 to operate in the same manner as described in connection with sensor 300.

FIG. 15 illustrates linear sensor 500 including circuitry 510 coupled to track member 506 and detection device 530. Member 506 and detection device 530 are configured so that at least one moves relative to the other to change position of detection device 530 along member 506. Member 506 includes linear segmented tracks 511 on sensor face 512. Tracks 511 extend along longitudinal axis L as illustrated. Tracks 511 define a Gray code electrode pattern 516 of alternating TRUE and COMPLEMENT electrodes 520. Ellipses are used to represent portions of the pattern that are not shown to enhance clarity. Detection device 530 and tracks 511 move relative to one another in the directions indicated by a double-headed arrow T3. Detection device 530 includes a detection electrode 532 that extends across tracks 511 to capacitively couple with electrodes 320 that it overlaps. Detection device 530 and electrode pattern 516 are coupled to circuitry 510 to operate in the same manner as described in connection with sensors 300 and 400, previously. Circuitry 310, 410, and 510 includes a microprocessor or microcontroller with operating logic in the form of programming instructions to carry out the desired operations. Alternatively or additionally, a Digital Signal Processor (DSP) and/or Application Specific Integrated Circuit (ASIC) could be utilized, and/or discrete, dedicated logic components corresponding to the components schematically represented in connection with sensors 100 and 200 could be utilized.

Figure 16:
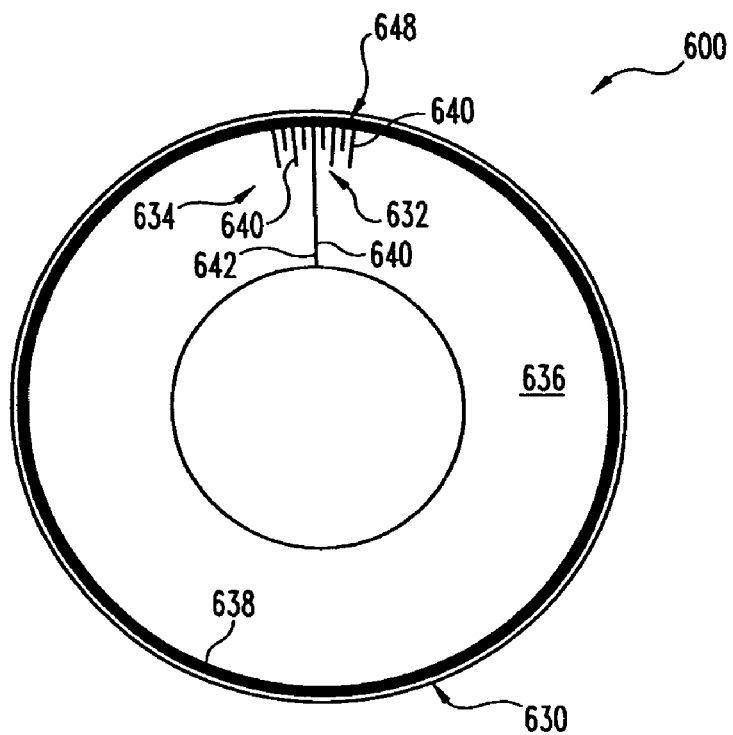
FIG. 16 is a planar view of another sensor type.
Figure 17:
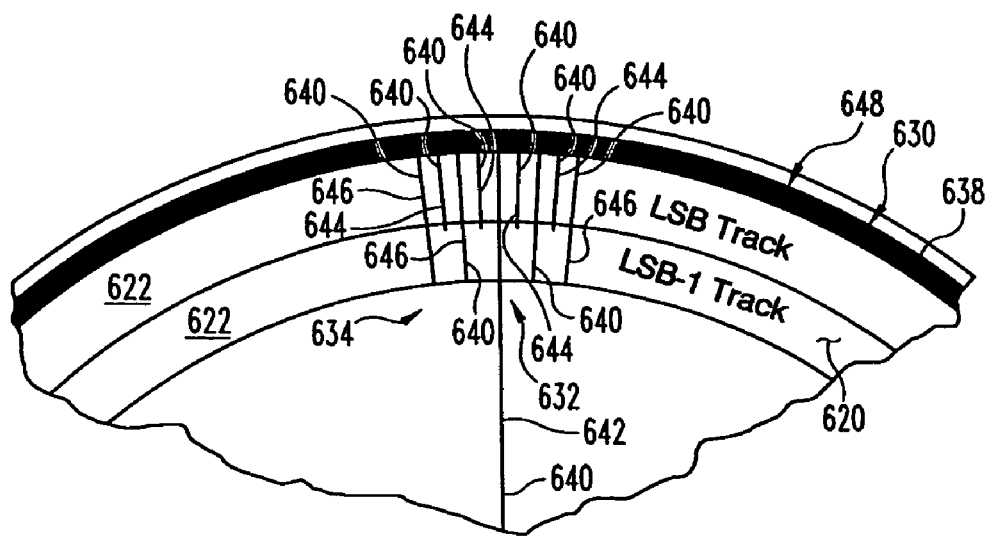
FIG. 17 is a partial view of the sensor shown in FIG. 16 including details of a pickup electrode.

Referring to FIGS. 16 and 17, sensor 600 is shown. Sensor 600 includes detection device 630. Device 630 can be used as an alternative to detection device 330 of sensor 300 shown in FIG. 13. Device 630 is provided in a planar, disk-shaped form to be positioned opposite and spaced apart from a encoding sensor face carrying concentric tracks, such as face 312 of sensor 300. FIG. 17 schematically depicts a partial overlay of encoding sensor face 620 with representative electrode tracks 622 that can be arranged the same as outer LSB and LSB-1 tracks of earlier described sensors. It should be appreciated that only two tracks are shown to preserve clarity. Device 630 includes electrically conductive electrode 632 as part of electrical conductor pattern 634 carried on nonconductive substrate 636. Electrode 632 is structured to capacitively couple with tracks 622. Pattern 634 can be made using standard photolithographic techniques. Pattern 634 includes capacitive coupling ring 638 electrically connected to electrode 634. Capacitive coupling ring 638 can be utilized to transmit the signal detected with device 630 to processing circuitry (not shown) of the type previously described in connection with other embodiments, such as sensor 300.

Electrode 632 includes a number of different portions 640. Portions 640 include central electrode portion 642 that is arranged to extend across all concentric tracks 622 of the encoder sensor face 620 from ring 638 (See FIG. 17). Portions 640 also include a number of single track portions 644 that only fully extend across a single track 622 (the LSB track) from ring 638 and two-track portions 646 that only fully extend across two tracks 622 corresponding to the LSB and LSB-1 tracks. The angular spacing of portions 644 is arranged so that portions 644 capacitively couple with encoder electrodes of the LSB track 622 that are being pulsed in the same manner at the same time. The angular spacing of portions 646 is arranged so that portions 646 capacitively couple with encoder electrodes of both the LSB and LSB-1 tracks 622 that are being electrically pulsed in the same manner at the same time. Portions 640 operate as a common electrical node 648, such that the electrical pulsing is additive, effectively multiplying the signal strength as to the LSB and LSB-1 tracks 622.

Figure 18:
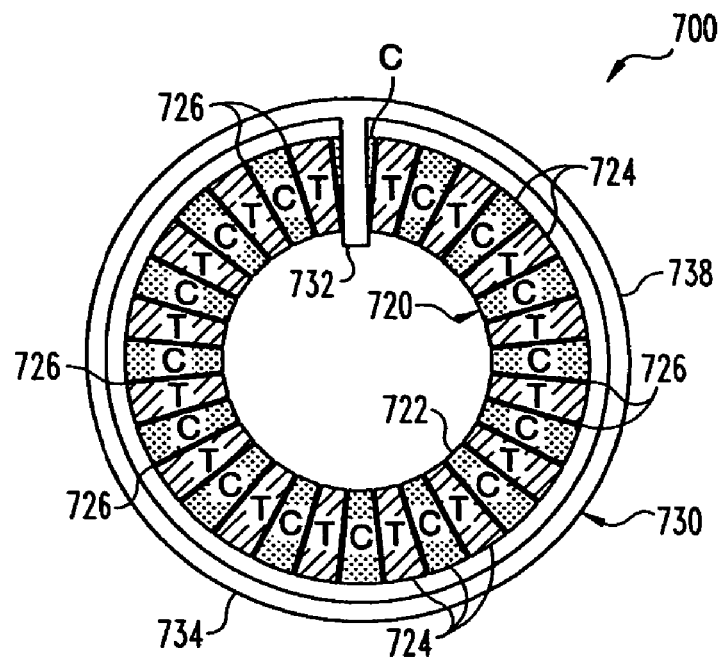
FIG. 18 is partial diagrammatic view of a single track position sensor of one type.

Referring to FIG. 18, sensor 700 is shown. Like sensor 600, sensor 700 includes circular encoder sensor face 720. Face 720 includes track 722 comprised of alternating TRUE (T) and COMPLEMENTARY (C) electrodes 724, which are schematically shown as partial sector areas (only a few are designated by reference numerals to preserve clarity). Electrodes 724 are each separated from another by a corresponding electrically nonconductive gap 726 (only a few are designated by reference numerals to preserve clarity). The TRUE and COMPLEMENT electrodes 724 are pulsed by positive and negative going pulses in the manner previously described for TRUE and COMPLEMENT electrodes, respectively. Overlaying face 720 is detection device 730. Device 730 is arranged with electrode 732 as part of electrically conductive pattern 734. Electrode 732 is positioned opposite track 722 and radially spans across track 722. Pattern 734 further includes capacitive coupling ring 738. Capacitive coupling ring 738 can be utilized to transit the signal detected with device 730 to processing circuitry of the type previously described in connection with other embodiments (not shown). In one operating mode, sensor 700 detects transitions between TRUE and COMPLEMENT electrodes 724 to correspondingly determine one of two binary states. By counting the number of changes in state, a relative change in angular displacement between face 720 and device 730 can be determined. Correspondingly, rotational speed, changes in acceleration, and like can be determined through such operation by comparison to a time base. Alternatively or additionally, previously described vernier interpolation techniques can be employed to resolve position of electrode 732 relative to a given pair of TRUE and COMPLEMENT electrodes 724. It should be appreciated that more than one electrode 732 could be used.

Figure 19:
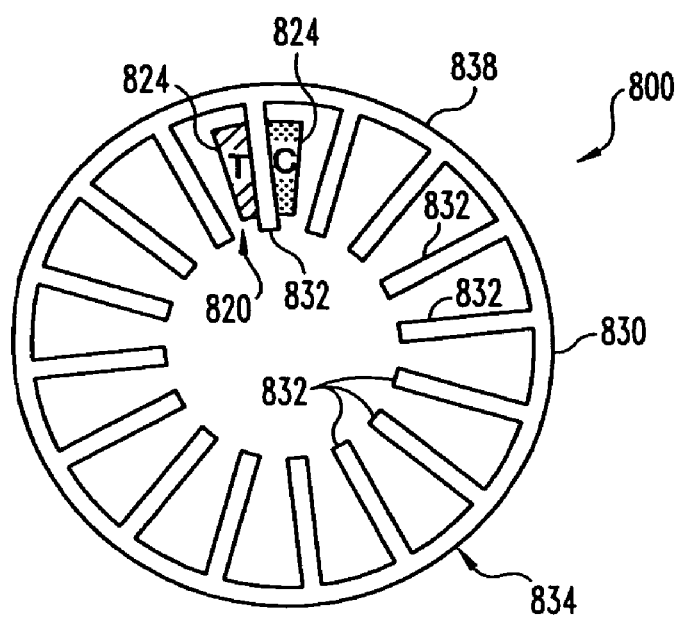
FIG. 19 is a partial diagrammatic view of a single track position sensor of another type.
Figure 20:
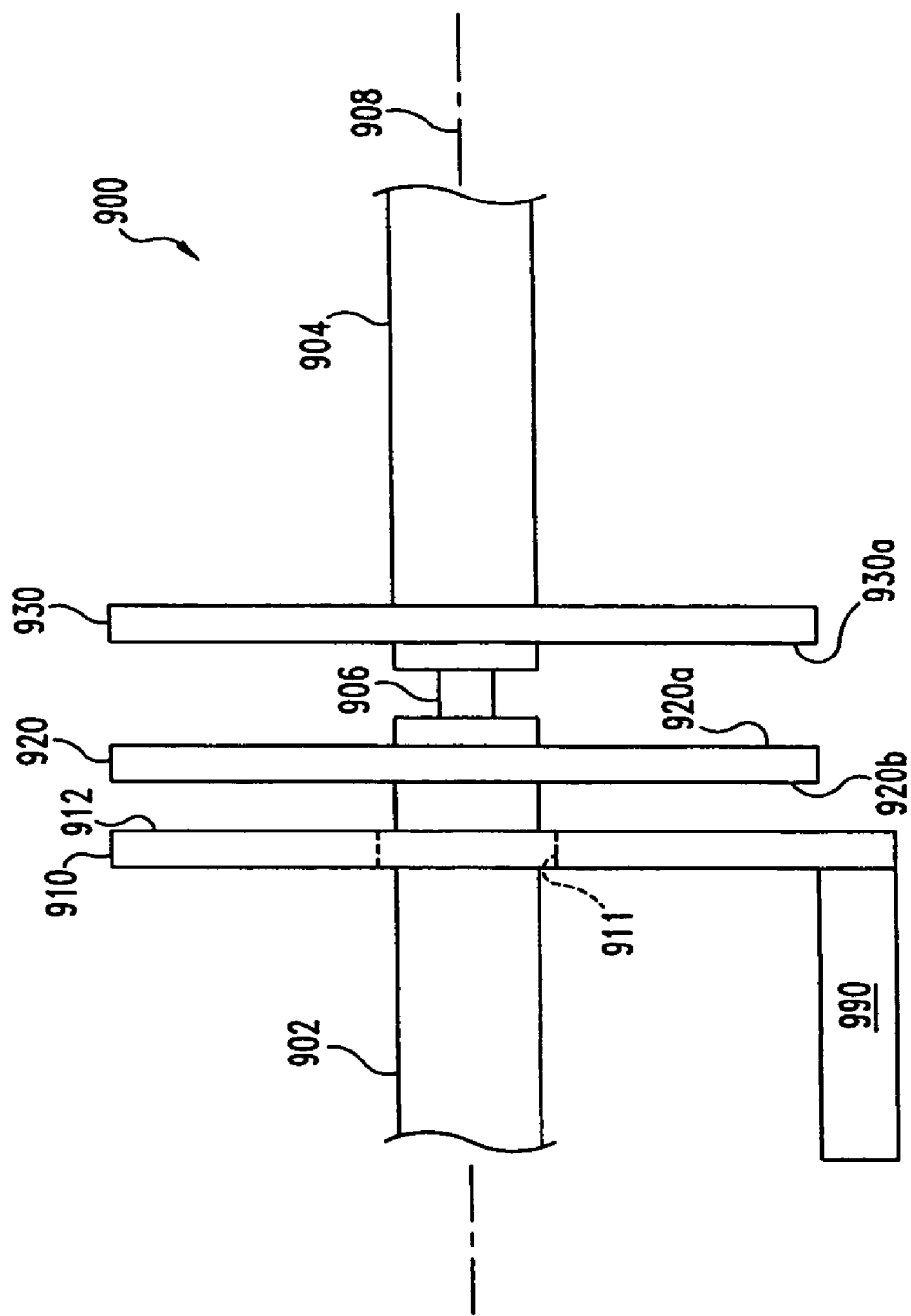
FIG. 20 is diagrammatic side view of a torque sensor.

Referring to FIG. 19, sensor 800 is shown. Like sensor 700, sensor 800 includes circular encoder sensor face 820. Sensor face 820 includes two electrodes 824, one pulsed as the TRUE type and the other pulsed as the COMPLEMENT type, which are schematically shown as partial sector areas. Electrodes 824 are each separated from another by an electrically nonconductive gap hidden by another feature (one of electrodes 832) in FIG. 19. Detection device 830 is positioned opposite face 820 and spaced apart therefrom. Device 830 is arranged with a number of angularly spaced apart electrodes 832 as part of electrically conductive pattern 834. Only a few of electrodes 832 are designated by reference numerals to preserve clarity. Electrodes 832 are each sized to span across electrodes 824 when aligned therewith. Pattern 834 further includes capacitive coupling ring 838. Capacitive coupling ring 838 can be utilized to transmit the signal detected with device 830 to processing circuitry (not shown). In one mode of operation, sensor 800 detects transitions between TRUE and COMPLEMENT electrodes 824 as each electrode 832 aligns to capacitively couple with electrodes 824 and correspondingly one of two binary states can be determined. By counting the number of changes in state, a relative change in angular displacement between face 820 and device 830 can be determined. Likewise, rotational speed, change in acceleration, and like can be determined through such operation by comparison to a time base. Alternatively or additionally, previously described vernier interpolation techniques can be employed to resolve position of electrode 832 relative to electrodes 824. It should be appreciated that more pairs of TRUE and COMPLEMENT electrodes could be used.

Referring to FIGS. 20-23, torque sensor 900 is illustrated. Sensor 900 includes shaft 902 and 904 joined together by a calibrated torsion bar 906. Shafts 902 and 904, and bar 906 have a common centerline axis 908 that one or more may turn about during use. Axis 908 is represented by crosshairs in FIGS. 21-23 because the view plane of these figures is perpendicular to the view plane of FIG. 20. Sensor 900 includes stator 910 that includes aperture 911 through which shaft 902 extends. Stator 910 is arranged to remain stationary relative to rotation of shaft 902. Stator 910 is operatively coupled to processing circuitry 990 that may be of the type described in connection with FIGS. 10-12 to perform vernier interpolation displacement processing.

Figure 21:
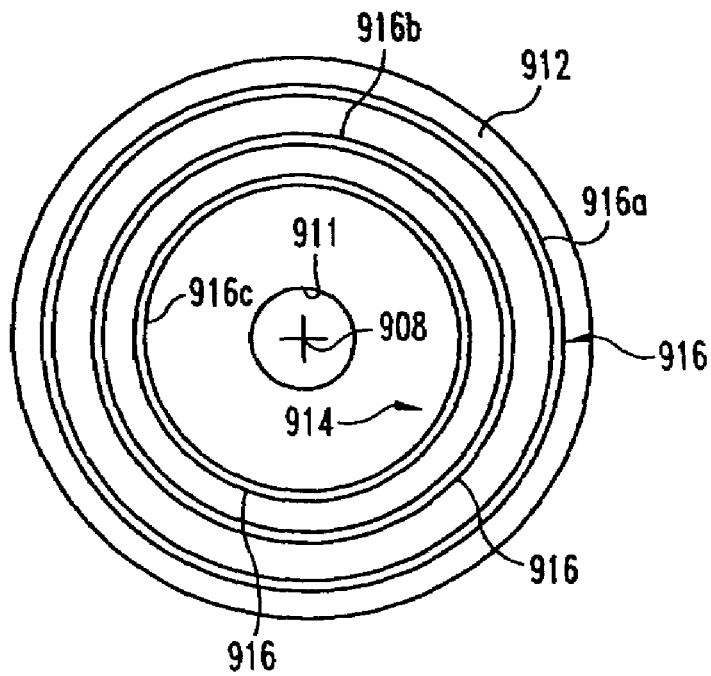
FIG. 21 is a partial diagrammatic view of a stator for the torque sensor of FIG. 20.

Stator 910 includes capacitive coupling face 912 shown in FIG. 21. Face 912 includes capacitive coupling pattern 914 with three concentric electrically conductive rings 916. Outer conductive ring 916a is arranged as a receiver ring to capacitively transmit detection signals to circuitry 990 as further described hereinafter. Inner driver rings 916b and 916c are configured to provide the positive and negative going pulses corresponding to TRUE and COMPLEMENT electrodes.

Figure 22:
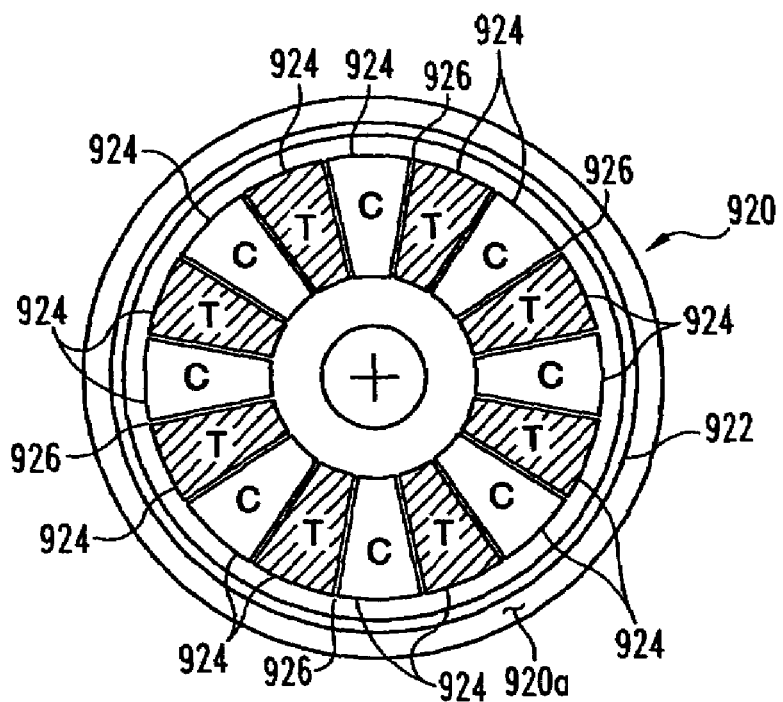
FIG. 22 is a partial diagrammatic view of an encoder rotor of the torque sensor of FIG. 20.

Sensor 900 also includes encoding sensor rotor 920. Rotor 920 is fixed to shaft 902 and to rotate therewith, and is positioned opposite stator 910. Rotor 920 includes electrode face 920a opposite capacitive coupling face 920b. Capacitive coupling face 920b includes three concentric electrically conductive rings appearing the same as those shown in FIG. 21 and being sized the same to align therewith. Electrode face 920a is illustrated in FIG. 22. Electrode face 920a includes outer coupling ring 922 that is connected to a like ring on face 920b by one or more electrically conductive vias through rotor 920. Face 920a also includes a number of alternating TRUE and COMPLEMENT electrodes 924 spaced apart from one another by electrically nonconductive gaps 926 (only a few of which are designated by reference numerals to preserve clarity). Electrodes 924 and gaps 926 are arranged in an approximately circular pattern. The TRUE electrodes 924 are electrically connected to one of the inner concentric rings on face 920b by electrically conductive vias through rotor 920 to receive corresponding TRUE pulses by capacitive coupling with one of rings 916b and 916c, and the COMPLEMENT electrodes 924 are electrically connected to the other of the inner concentric rings on face 920b by electrically conductive vias through rotor 920 to receive corresponding COMPLEMENT pulses by capacitive coupling with the other of rings 916b and 916c.

Figure 23:
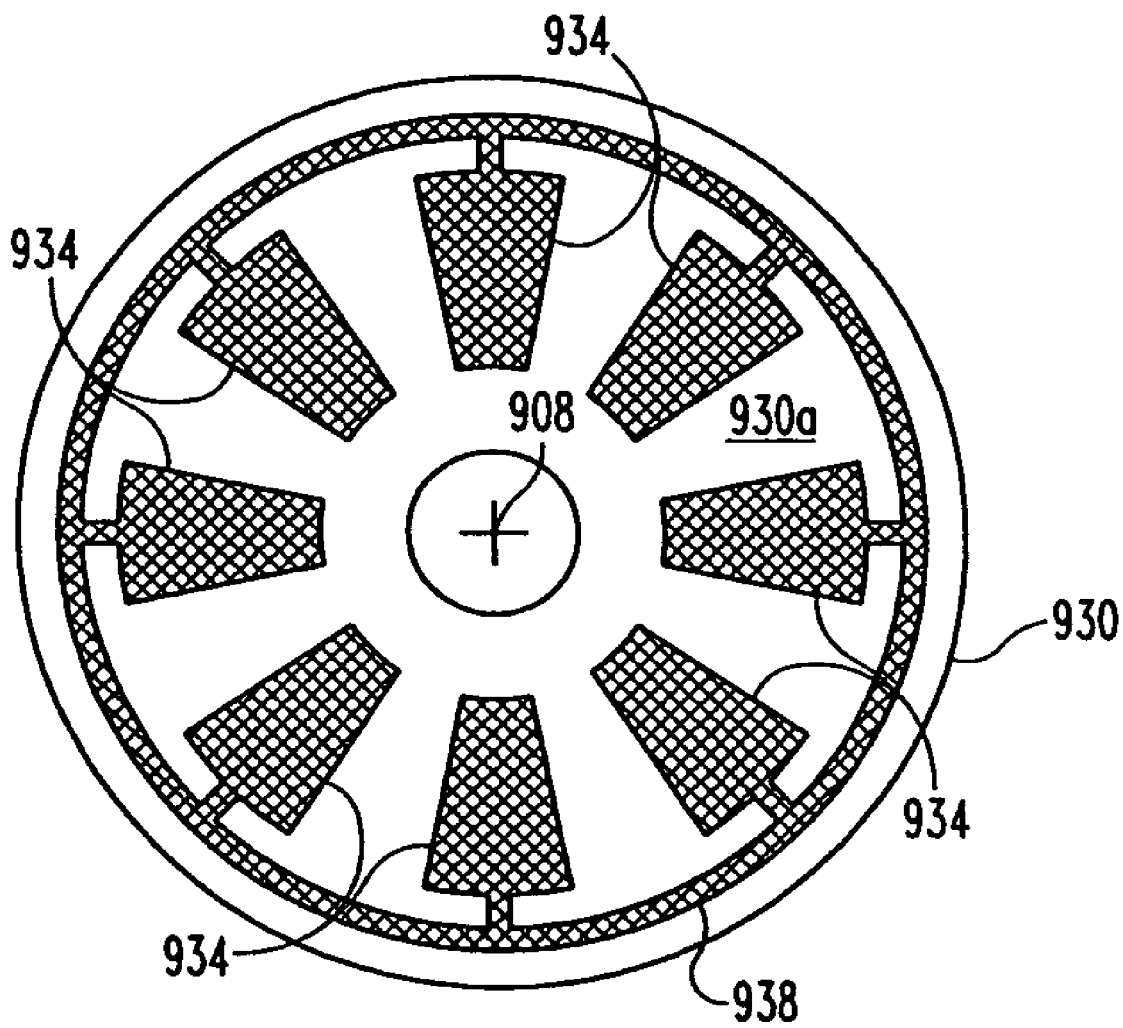
FIG. 23 is a partial diagrammatic view of a pickup rotor of the torque sensor of FIG. 20.

Sensor 900 also includes pickup sensor rotor 930. Rotor 930 is fixed to shaft 904 to rotate therewith. As shown in FIG. 23, rotor 930 includes face 930a with pickup electrodes 934 electrically connected to capacitive coupling ring 938. Ring 938 is structured to be capacitively coupled to ring 922, which in turn is structured to be capacitively coupled to ring 916a. Ring 916a is in electrical contact with circuitry 990.

Referring to FIGS. 20-23, various operational features are next described. As torque is applied to shaft 902 and/or 904, torsion bar 906 selectively allows for relative rotation between shafts 902 and 904. In response, a rotational displacement occurs between rotor 920 and rotor 930 indicative of an amount of torque. As TRUE and COMPLEMENT pulses are applied to TRUE and COMPLEMENT electrodes 924 via capacitive coupling rings 916, the resulting capacitively emitted signals from rotor 920 are detected with pickup electrodes 934. These detected signals are provided to circuitry 990 through capacitive coupling of ring 938 to ring 922 and capacitive coupling of ring 922 to ring 916a. Circuitry 990 processes the received signals form ring 916a to perform one or more of the vernier interpolation techniques previously described to resolve position to one of a number of positions corresponding to range R2 from a point along one of electrodes 924 across a separating gap 926 to the adjacent electrode 924. In one preferred form, position is resolved to one of at least four positions along range R2. In a more preferred embodiment, position is resolved to one of at least eight positions along range R2. In an even more preferred embodiment, position is resolved to at least one of 64 positions along range R2.

Many other embodiments are envisioned. For example, another embodiment of an encoding sensor apparatus includes:

a.) A stationary encoder made from conductive patterns on a nonconductive substrate. The conductive patterns are configured in a multi-bit code by electrically isolated sectors arranged in a unique sequence transverse to the direction of sensor movement to create a bit pattern that uniquely identifies position along the direction of sensor movement. The transverse bit code is propagated in the direction of sensor movement by adjacent, electrically isolated conductive patterns. In the direction of sensor movement, alternating adjacent sectors are electrically connected to a common node, creating two electrical connection points for each transverse bit. Each conductive sector in the resulting pattern constitutes one plate of a capacitor structure.

b.) A movable pickoff structure constructed of a conductive material, and extending in length to cover the encoder pattern in the direction transverse to the measurement direction and determined by the length of the bit code of the encoder, with a width in the direction of measurement movement determined by the resolution of the sensor. The pickoff is held at a fixed distance from the encoder pattern surface creating the second plate of a capacitor structure through the overlapping areas with the encoder pattern.

c.) A capacitive transmission structure made of conductive material electrically connected to the moving pickoff structure and comprising one plate of a capacitive structure and a second matching conductive pattern on a stationary non-conductive substrate such that the pickoff connected structure is always closely positioned parallel to this second pattern, thus creating the second plate of a capacitor structure d.) An electronic circuit attached to the encoder pattern and capable of simultaneously generating a series of positive going pulses and negative going pulses, applied respectively to adjacent patterns of the conductive encoder pattern in the direction of measurement movement. The circuit then sequentially and continuously applies subsequent pulses to adjacent encoder patterns in the direction transverse to the sensor measurement direction.

e.) A detection circuit connected to the stationary plate of the transmission structure that can sense the presence of a positive going pulse or a negative going pulse transmitted through the capacitive coupling of the applied pulses from the encoder pattern to the pickoff structure, and then to the moving transmission structure.

f.) A decoding circuit that can interpret a series of positive and negative pulse events as a series of binary states uniquely representative of the pickoff position relative to the encoder pattern.

In a further embodiment of the invention, the non-contacting position sensor includes two or more movable pickoff structures spaced at predetermined intervals with the equivalent number of transmission structures and detection circuits. In another example, a sensor is provided which includes one or more of the following elements and features:

a.) A stationary encoder made from conductive patterns on a nonconductive substrate. The conductive patterns are configured in a multi-bit code by electrically isolated sectors arranged in a unique sequence transverse to the direction of sensor movement to create a bit pattern that uniquely identifies that position along the direction of sensor movement. The transverse bit code is propagated in the direction of sensor movement by adjacent, electrically isolated conductive patterns. In the direction of sensor movement, alternating adjacent sectors are electrically connected to a common node, creating two electrical connection points for each transverse bit. One of those electrical connection nodes connected to circuit ground. Each conductive sector in the resulting pattern constitutes one plate of a capacitor structure.

b.) A movable pickoff structure constructed of a conductive material and extending in length to cover the encoder pattern in the direction transverse to the measurement direction and determined by the length of the bit code of the encoder, with a width in the direction of measurement movement determined by the resolution of the sensor. The pickoff is held at a fixed distance from the encoder pattern surface creating the second plate of a capacitor structure through the overlapping areas with the encoder pattern.

c.) A capacitive transmission structure made of conductive material electrically connected to the moving pickoff structure and comprising one plate of a capacitive structure and a second matching conductive pattern on a stationary non-conductive substrate such that the pickoff connected structure is always closely positioned parallel to this second pattern, thus creating the second plate of a capacitor structure.

d.) An electronic circuit attached to the encoder pattern and capable of generating a series of positive going pulses or negative going pulses applied to the ungrounded connection point of the conductive encoder pattern in the direction of measurement movement. The circuit then sequentially and continuously applies subsequent pulses to adjacent encoder patterns in the direction transverse to the sensor measurement direction.

e.) A detection circuit connected to the stationary plate of the transmission structure that can sense the presence of a positive going pulse or a negative going pulse transmitted through the capacitive coupling of the applied pulses from the encoder pattern to the pickoff structure, and then to the moving transmission structure.

f.) A decoding circuit that can interpret a series of positive or negative pulse events as a series of binary states uniquely representative of the pickoff position relative to the encoder pattern.

In yet another example, a sensor is provided which includes one or more of the following elements and features:

a.) A stationary encoder made from conductive patterns on a nonconductive substrate. The conductive patterns configured in a multi-bit code by electrically isolated sectors arranged in a unique sequence transverse to the direction of sensor movement to create a bit pattern that uniquely identifies that position along the direction of sensor movement. The transverse bit code is propagated in the direction of sensor movement by adjacent, electrically isolated conductive patterns. In the direction of sensor movement, alternating adjacent sectors are electrically connected to a common node, thereby creating two electrical connection points for each transverse bit. One of those electrical connection nodes connected to circuit ground. Each conductive sector in the resulting pattern constitutes one plate of a capacitor structure.

b.) A primary movable pickoff structure constructed of a conductive material and extending in length to cover the encoder pattern in the direction transverse to the measurement direction and determined by the length of the bit code of the encoder, with a width in the direction of measurement movement determined by the resolution of the sensor. The pickoff is held at a fixed distance from the encoder pattern surface creating the second plate of a capacitor structure through the overlapping areas with the encoder pattern.

c.) A secondary movable pickoff structure constructed of conductive material segments and extending in radial length to cover the encoder pattern in the direction transverse to the measurement direction and determined by the length of the bit code of the encoder, with a width in the direction of measurement movement determined by the resolution of the sensor. The pickoff structure is divided the number of segments equal to the bit code length. Each segment is spatially offset in either an angular position for rotary sensing or linear position for linear sensing such that the resulting overlapping code with the stationary encoder pattern is bit by bit opposite the pattern overlapped by the primary pickoff. The pickoff is held at a fixed distance from the encoder pattern surface creating the second plate of a capacitor structure through the overlapping areas with the encoder pattern.

d.) Two capacitive transmission structures made of conductive material, each electrically connected to one of the two moving pickoff structures and comprising one plate of a capacitive structure and two matching conductive patterns on a stationary non-conductive substrate such that the pickoff connected structure is always closely positioned parallel to this second pattern, thus creating the second plate of a capacitor structure e.) An electronic circuit attached to the encoder pattern and capable of generating a series of positive going pulses or negative going pulses applied to the ungrounded connection point of the conductive encoder pattern in the direction of measurement movement. The circuit then sequentially and continuously applies subsequent pulses to adjacent encoder patterns in the direction transverse to the sensor measurement direction.

f.) Two detection circuits connected to the stationary plates of the transmission structures that can sense the presence of a positive going pulse or a negative going pulse transmitted through the capacitive coupling of the applied pulses from the encoder pattern to the pickoff structures, and then to the moving transmission structure.

g.) A decoding circuit that can combine the two pulse sequences from the primary and secondary pickoffs to generate a series of positive or negative pulse events as a series of binary states uniquely representative of the pickoff position relative to the encoder pattern.

In a further embodiment of the invention, the non-contacting position sensor includes two or more movable pickoff structures spaced at predetermined intervals with the equivalent number of transmission structures and detection circuits.

In still another example, a sensor is provided which includes one or more of the following elements and features:

a.) A stationary encoder made from two conductive patterns on a nonconductive substrate. The conductive patterns are configured such that they bisect the distance to be measured, with each pattern creating one plate of a capacitive structure.

b.) A movable pickoff structure constructed of a conductive material and extending in length to cover the encoder pattern in the direction transverse to the measurement direction with a width in the direction of measurement movement determined by the resolution of the sensor and approximately equal to one half the measurement distance. The pickoff is held at a fixed distance from the encoder pattern surface forming the second plate of a capacitor structure through the overlapping areas with the encoder pattern.

c.) A capacitive transmission structure made of conductive material electrically connected to the moving pickoff structure and comprising one plate of a capacitive structure and a second matching conductive pattern on a stationary non-conductive substrate such that the pickoff connected structure is always closely positioned parallel to this second pattern, thus creating the second plate of a capacitor structure d.) An electronic circuit attached to the encoder pattern and capable of sequentially generating a series of alternating positive going pulses and negative going pulses, with the pulses applied respectively and continuously to the adjacent patterns of the conductive encoder pattern in the direction of measurement movement.

e.) A detection circuit electrically connected to the stationary plate of the transmission structure that can capture and store the amplitude of the positive going pulse and the negative going pulse transmitted through the capacitive coupling of the applied pulses from the encoder pattern to the pickoff structure, and then to the moving transmission structure.

f.) A decoding circuit that can use the amplitude values in a ratiometric fashion to determine the relative position of the pickoff within the sensing range.

In a further example, a sensor is provided which includes one or more of the following elements and features:

a.) A stationary encoder made from two conductive patterns on a nonconductive substrate. The conductive patterns are configured such that they bisect the distance to be measured, with each pattern forming a plate of a capacitive structure b.) A movable pickoff structure constructed of a conductive material and extending in length to cover the encoder pattern in the direction transverse to the measurement direction with a width in the direction of measurement movement determined by the resolution of the sensor and approximately equal to one half the measurement distance. The pickoff is held at a fixed distance from the encoder pattern surface to create the second plate of a capacitor structure through the overlapping areas with the encoder pattern.

c.) A capacitive transmission structure made of conductive material electrically connected to the moving pickoff structure and comprising one plate of a capacitive structure and a second matching conductive pattern on a stationary non-conductive substrate such that the pickoff connected structure is always closely positioned parallel to this second pattern, thus creating the second plate of a capacitor structure d.) An electronic circuit attached to the encoder pattern and capable of simultaneously applying a positive going pulse one encoder pattern and a negative going pulse to the other, followed by a uni-polar pulse (either positive or negative) applied simultaneously to both encoder patterns. This pattern is repeated continuously.

e.) A detection circuit electrically connected to the stationary plate of the transmission structure that can capture and store the amplitude of the simultaneous bi-polar pulse received and uni-polar pulse transmitted through the capacitive coupling of the applied pulses from the encoder pattern to the pickoff structure, and then to the moving transmission structure.

f.) A decoding circuit that can use the amplitude values in a ratiometric fashion to determine the relative position of the pickoff within the sensing range.

Another example is an apparatus including: means for providing a sensor face including a first electrode spaced apart from a second electrode by an electrically nonconductive gap along the sensor face; means for applying a first voltage waveform to the first electrode and a second voltage waveform to the second electrode, the second voltage waveform being approximately an inversion of the first voltage waveform; means for emitting a first signal from the first electrode and a second signal from the second electrode in response to the applying means; means for combining the first signal and the second signal with a third electrode positioned opposite the sensor face and capacitively coupled to the first electrode and the second electrode; and means for determining information corresponding to position of the sensing member relative to the first electrode and the second electrode as a function of the combination.

Still another example includes: means for generating a signal pattern to repetitively provide a changing voltage to each of two or more tracks of a sensor, means for capacitively coupling an electrode of the sensor to the tracks to determine a first electrode position, means for moving at least one of the electrode and the tracks relative to the other to result in a second electrode position different than the first, and means for detecting a second group of signals emitted in response to the signal pattern with the electrode capacitively coupled to the tracks to determine the second electrode position.

In another example, a sensor includes a sensor track with a first electrode spaced apart from a second electrode by an electrically nonconductive gap, and a third electrode positioned opposite this track. The sensor also includes means for providing a first voltage waveform to the first electrode and a second voltage waveform to the second electrode where such waveforms differ from one another. Also included are means for capacitively coupling the third electrode to the track to detect a first signal from the first electrode in response to the first waveform and a second signal from the second electrode in response to the second waveform, and means for determining information representative of position of the third electrode along the sensor track as a function of the first signal and the second signal.

Further, it should be appreciated that among the forms of the present invention the circuitry utilized can be in many different forms. For example, some or all of such circuitry can be implemented with one or more microprocessors, microcontrollers, digital signal processors, application specific integrated circuits, dedicated circuitry, or the like with some or all operating logic being implemented in the form of software programming instructions, firmware, and/or dedicated hardwired logic. Alternatively or additionally, sensors according to the embodiments of the present application can determine position relative to one member moving while the other remains fixed and/or by moving two or more members relative to one another to result in positional changes. Likewise, as contrasted by a comparison of sensor 500 to sensors 300 and 400, positional changes can be brought about by rotation, translation, or a combination of such movement types. Furthermore, displacement information other than position can also be determined such as velocity, speed, acceleration, or the like using corresponding operating logic.

While the invention has been illustrated and described in detail in the drawings and foregoing description, the same is to be considered illustrative and not restrictive in character, it being understood that only selected embodiments have been shown and described and that all changes, equivalents, and modifications that come within the scope of the inventions described herein or defined by the following claims are desired to be protected. Any experiments, experimental examples, or experimental results provided herein are intended to be illustrative of the present invention and should not be construed to limit or restrict the invention scope. Further, any theory, mechanism of operation, proof, or finding stated herein is meant to further enhance understanding of the present invention and is not intended to limit the present invention in any way to such theory, mechanism of operation, proof, or finding. In reading the claims, words such as "a", "an", "at least on", and "at least a portion" are not intended to limit the claims to only one item unless specifically stated to the contrary. Further, when the language "at least a portion" and/or "a portion" is used, the claims may include a portion and/or the entire item unless specifically stated to the contrary.

What is claimed is:

1. A method, comprising:
   generating a signal pattern to repetitively provide a changing voltage to each of two or more tracks of a sensor;
   capacitively coupling an electrode of the sensor to the tracks to determine a first electrode position along the tracks by detecting a first group of signals emitted in response to the signal pattern, a first one of the tracks includes a first set of electrode segments each spaced apart from another by a corresponding one of a first set of electrically nonconductive gaps, a second one of the tracks includes a second set of electrode segments each spaced apart from another by a corresponding one of a second set of electrically nonconductive gaps, the first set of electrode segments includes a first electrode subset and a second electrode subset, and each member of the first electrode subset alternates with a member of the second electrode subset along the first one of the tracks;
   moving at least one of the electrode and the tracks relative to another of the electrode and the tracks to result in a second electrode position along the tracks different from the first electrode position; and
   detecting a second group of signals emitted in response to the signal pattern with the electrode capacitively coupled to the tracks to determine the second electrode position.

2. The method of claim 1, wherein said moving includes rotating at least one of the tracks and the electrode, and the tracks are each in a closed loop form.

3. The method of claim 1, wherein the generating includes:
providing a first voltage waveform to one of the electrode segments in the first subset to cause a first signal to be emitted there from that belongs to the first group;
providing a second voltage waveform to one of the electrode segments in the second subset to cause a second signal to be emitted there from that belongs to the first group;
while in the first electrode position, the electrode overlapping the one of the electrode segments in the first subset, the one of the electrode segments in the second subset, and an electrically nonconductive gap positioned therebetween; and
determining the first electrode position as a function of the first signal and the second signal.

4. The method of claim 3, wherein the first voltage waveform is provided to the one of the electrode segments of the first subset as the second voltage waveform is provided to the one of the electrode segments of the second subset, the second signal is approximately an inverted form of the first signal, and the electrode provides an output signal representative of a sum of the first signal and the second signal.

5. The method of claim 3, which includes:
applying the first voltage waveform and the second voltage waveform at different times in accordance with an established sequence;
providing an output signal from the electrode for each of the first signal and the second signal; and
interpolating the first electrode position as a function of the first signal and the second signal, the first one of the tracks having more electrode segments than the second one of the tracks.

6. The method of claim 1, wherein the electrodes of the second set each have a length along the second one of the tracks greater than each of the electrodes of the first set along the first one of the tracks.

7. A method, comprising:
generating a signal pattern to repetitively provide a changing voltage to each of two or more tracks of a sensor,
capacitively coupling an electrode of the sensor to the tracks to determine a first electrode position along the tracks by detecting a first group of signals emitted in response to the signal pattern, with a first one of the tracks including a first set of electrode segments having a first electrode subset and a second electrode subset wherein each member of the first electrode subset alternates with a member of the second electrode subset along the first one of the tracks;
moving at least one of the electrode and the tracks relative to another of the electrode and the tracks to result in a second electrode position along the tracks different from the first electrode position; and
detecting a second group of signals emitted in response to the signal pattern with the electrode capacitively coupled to the tracks to determine the second electrode position.

8. The method of claim 7, wherein said moving includes rotating at least one of the tracks and the electrode, and the tracks are each in a closed loop form.

9. The method of claim 7, wherein the generating includes:
providing a first voltage waveform to one of the electrode segments in the first subset to cause a first signal to be emitted there from that belongs to the first group;
providing a second voltage waveform to one of the electrode segments in the second subset to cause a second signal to be emitted there from that belongs to the first group;
while in the first electrode position, the electrode overlapping the one of the electrode segments in the first subset, the one of the electrode segments in the second subset, and an electrically nonconductive gap positioned therebetween; and
determining the first electrode position as a function of the first signal and the second signal.

10. The method of claim 9, wherein the first voltage waveform is provided to the one of the electrode segments of the first subset as the second voltage waveform is provided to the one of the electrode segments of the second subset, the second signal is approximately an inverted form of the first signal, and the electrode provides an output signal representative of a sum of the first signal and the second signal.

11. The method of claim 9, which includes:
applying the first voltage waveform and the second voltage waveform at different times in accordance with an established sequence;
providing an output signal from the electrode for each of the first signal and the second signal; and
interpolating the first electrode position as a function of the first signal and the second signal, the first one of the tracks having more electrode segments than the second one of the tracks.

12. The method of claim 8, wherein the electrodes of the second set each have a length along the second one of the tracks greater than each of the electrodes of the first set along the first one of the tracks.

* * * * *